(12) United States Patent
Park et al.

(10) Patent No.: US 7,820,368 B2
(45) Date of Patent: Oct. 26, 2010

(54) PHOTORESIST STRIPPER COMPOSITION AND METHODS FOR FORMING WIRE STRUCTURES AND FOR FABRICATING THIN FILM TRANSISTOR SUBSTRATE USING COMPOSITION

(75) Inventors: Hong-sick Park, Suwon-si (KR);
Shi-yul Kim, Yongin-si (KR);
Jong-hyun Choung, Suwon-si (KR);
Won-suk Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1127 days.

(21) Appl. No.: 11/493,225

(22) Filed: Jul. 25, 2006

(65) Prior Publication Data

US 2007/0020910 A1    Jan. 25, 2007

(30) Foreign Application Priority Data

Jul. 25, 2005    (KR) .................... 10-2005-0067479

(51) Int. Cl.
*H01L 21/44* (2006.01)
(52) U.S. Cl. ..................................... 430/329
(58) Field of Classification Search .............. None
See application file for complete search history.

(56) References Cited

FOREIGN PATENT DOCUMENTS

| JP | 2000-208773 | 7/2000 |
|---|---|---|
| JP | 2001-223365 | 8/2001 |
| JP | 2004-163901 | 6/2004 |
| KR | 10-2004-98750 | 11/2004 |

OTHER PUBLICATIONS

Patent Abstracts of Japan, Publication No. 2000-208773, Jul. 28, 2000, 1 p.
Patent Abstracts of Japan, Publication No. 2001-223365, Aug. 17, 2001, 1 p.
Patent Abstracts of Japan, Publication No. 2004-163901, Jun. 10, 2004, 2 pp.
Korean Patent Abstracts, Publication No. 1020040098750, Nov. 26, 2004, 1 p.

*Primary Examiner*—John A McPherson
*Assistant Examiner*—Anna L Verderame
(74) *Attorney, Agent, or Firm*—Innovation Counsel LLP

(57) ABSTRACT

A photoresist stripper composition, a method for forming wire structures thereby, and a method of fabricating a thin film transistor substrate using the composition. The photoresist stripper composition includes about 50 WT % to about 70 WT % of butyldiglycol, about 20 to about 40 WT % of an alkylpyrrolidone, about 1 WT % to about 10 WT % of an organic amine compound, about 1 to about 5 WT % of aminopropylmorpholine, and about 0.01 to about 0.5 WT % of a mercapto compound.

18 Claims, 26 Drawing Sheets

PHOTORESIST STRIPPER COMPOSITION AND METHODS FOR FORMING WIRE STRUCTURES AND FOR FABRICATING THIN FILM TRANSISTOR SUBSTRATE USING COMPOSITION

This application claims priority from Korean Patent Application No. 10-2005-0067479 filed on Jul. 25, 2005 in the Korean Intellectual Property Office, the disclosure of which is incorporated herein by reference in its entirety.

BACKGROUND OF THE INVENTION

1. Field of the Invention

The present invention relates to a photoresist stripper composition, and more particularly, to a photoresist stripper composition for forming copper wire structures, a method for forming copper wire structures using the composition, and a method for fabricating a thin film transistor substrate using the composition.

2. Description of the Related Art

Semiconductor integrated circuits, devices, and apparatus play an increasing important role in modern society, and are widely used in many industries. In particular, a growing information-oriented society continually drives the development of new electronic displays, with new display functions being devised and added to meet the ever-diversifying needs of display users. Conventionally, cathode ray tubes (CRTs) have played a major role in the electronic display industry. However, CRTs bear the disadvantages of being heavier, bulkier, and more power-hungry than flat panel displays with a comparable display size. Therefore, flat panel displays such as liquid crystal displays (LCDs), organic electroluminescent (EL) displays, plasma display panels, and the like, are gaining widespread popularity as replacements for CRTs, and a demand is building for large, high-resolution screens.

Certain flat panel displays, such as LCDs and organic EL displays, employ a thin film transistor (TFT) as a switching and/or driving device. A TFT typically is controlled by signals transmitted over a gate line and a data line. The TFT, the gate line and the data line require fine patterns, which are usually formed by a photolithographic etching process using photoresist.

Larger screen displays using fine-patterned TFTs face the challenge of overcoming significant signal delays due to longer signal lines with reduced cross-sectional areas. One solution to this problem is to employ a low-resistivity wire structure. A low-resistivity wire structure typically is made of a material such as copper (Cu) or silver (Ag). In comparison to silver, copper exhibits similar resistivity yet is more cost-effective. However, copper may adhere poorly to an underlying structure, and thus, may be susceptible to separating or peeling off from the underlying structure. Furthermore, even if made to adhere to underlying structures, copper can be susceptible to by oxidation or corrosion by the photoresist stripper materials used to remove photoresist films during the patterning process. Copper degradation reduces the advantages of the copper conductive layer as a low-resistivity wire structure, because it increases the total resistance of the wire structures. Techniques suggested to address these problems have included diluting the photoresist stripper, and reducing the exposure of copper wire structures to a photoresist stripper. However, these techniques may reduce the reliability of copper wiring, because they tend to reduce the stripping capability of a photoresist stripper and allow the formation of a residual photoresist film. Therefore, there is an increasing demand for a photoresist stripper composition exhibiting good stripping capability while suppressing oxidation and corrosion of a copper conductive layer.

SUMMARY OF THE INVENTION

The present invention provides embodiments of a photoresist stripper composition; a method for forming wire structure using the photoresist stripper composition embodiments; and a method for fabricating a thin film transistor substrate using the photoresist stripper composition embodiments. The inventive photoresist stripper composition embodiments according to the present invention exhibit good stripping capability, while substantially preventing the oxidation and corrosion of wire structures, including copper wire structures. According to an aspect of the present invention, a photoresist stripper composition is provided, having butyl diglycol in a concentration of between about 50 weight percent concentration (WT %) to about 70 WT %; an alkylpyrrolidone of between about 20 WT % to about 40 WT %; an organic amine compound in a concentration of between about 1 WT % to about 10 WT %; aminopropylmorpholine in a concentration of between about 1 WT % to about 5 WT %, and a mercapto compound in a concentration of between about 0.01 WT % to about 0.5 WT %.

Another aspect of the present invention provides a method of forming a wire structure including depositing a copper-containing conductive layer on an underlying lower structure; forming a photoresist pattern that defines a wire structure on the conductive layer; etching the conductive layer using the photoresist pattern as an etching mask; and stripping the photoresist pattern using a photoresist stripper composition including constituents butyldiglycol in a concentration of between about 50 WT % to about 70 WT %; an alkylpyrrolidone in a concentration of between about 20 WT % to about 40 WT %; an organic amine compound in a concentration of between about 1 WT % to about 10 WT %; aminopropylmorpholine in a concentration of between about 1 WT % to about 5 WT %, and a mercapto compound in a concentration of between about 0.01 WT % to about 0.5 WT %.

Still another aspect of the present invention provides a method of fabricating a thin film transistor substrate including forming a gate wire structure on an insulating substrate, where the gate wire structure include a gate line extending in a first direction and a gate electrode connected to the gate line; and forming a data wire structure insulated from the gate wire structure on the insulating substrate, where the data wire structure includes a data line extending in a second direction to intersect with the gate line, a source electrode connected to the data line, and a drain electrode separated from the source electrode. Forming of one or both of the gate wire structure and the data wire structure includes: depositing a copper-containing conductive layer on the underlying lower structure; forming a photoresist pattern defining the respective one of the gate wire structure and the data wire structure on the conductive layer; etching the conductive layer using the photoresist pattern as an etching mask; and stripping the photoresist pattern using a photoresist stripper composition comprising constituents butyl diglycol in a concentration of between about 50 WT % to about 70 WT %; an alkylpyrrolidone in a concentration of between about 20 WT % to about 40 WT %; an organic amine compound in a concentration of between about 1 WT % to about 10 WT %; aminopropylmorpholine in a concentration of between about 1 WT % to about 5 WT %, and a mercapto compound in a concentration of between about 0.01 WT % to about 0.5 WT %.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
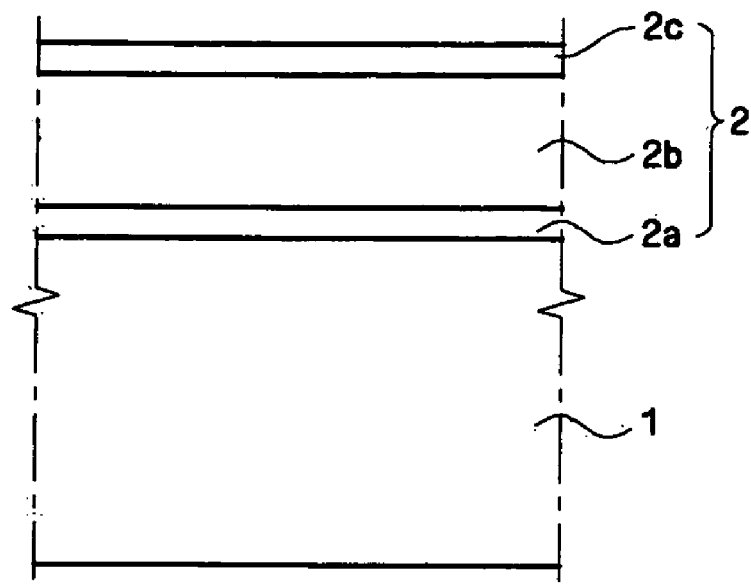
FIGS. 1 through 3 are sequential sectional views illustrating a method of forming a wire structure according to an embodiment of the present invention.
Figure 2:
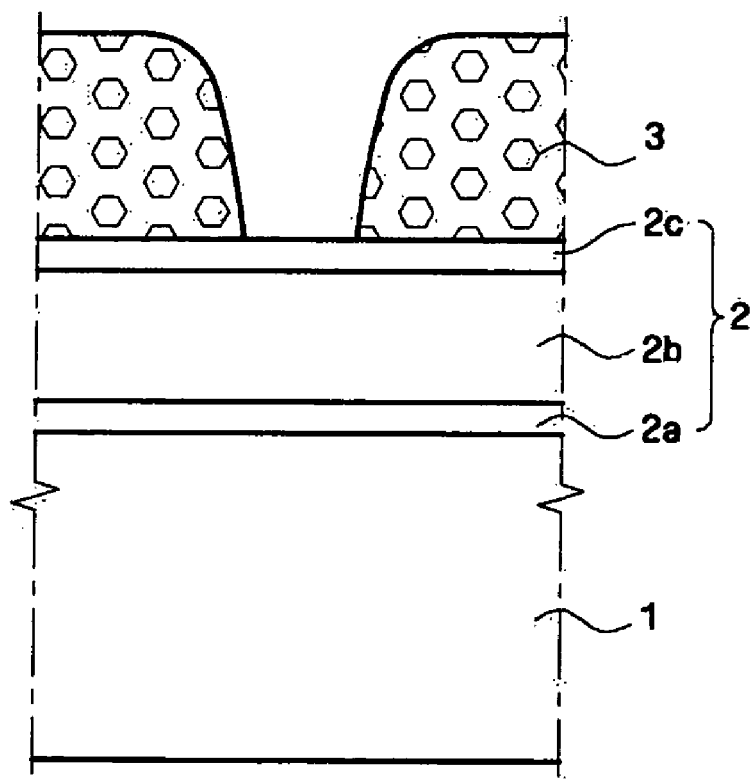
Figure 3:
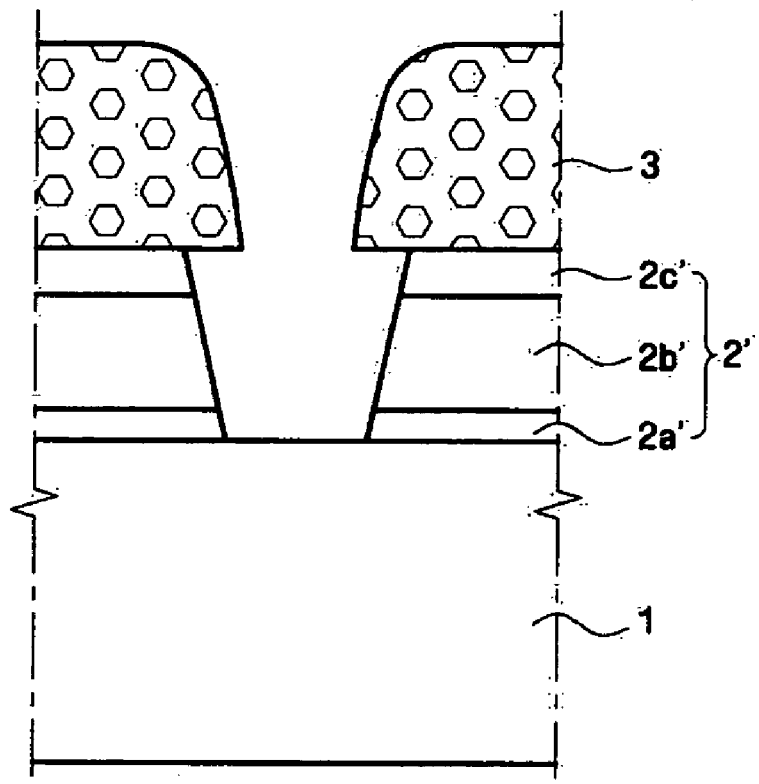

The present invention will now be described more fully hereinafter with reference to the accompanying drawings, in which the same reference numbers indicate the same components throughout the specification. In the attached figures, the thickness of layers and regions may be exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. A method for forming a wire structure according to an embodiment of the present invention will now be described more fully with reference to the accompanying drawings, in which FIGS. 1 through 3 are sequential sectional views illustrating a wire structure forming method according to an embodiment of the present invention. Referring to FIG. 1, lower structure 1 is prepared for use as an underlying structure providing a surface for forming three-layered structure 2. Lower structure 1 may be a simple, single-layered structure, as well as a complex, multi-layered structure. An exemplary lower structure 1 may be, without limitation, an insulator substrate made of glass, a semiconductor layer made of amorphous silicon, or an insulation layer.

Copper-containing conductive layer 2b is deposited on lower structure 1, for example, as one layer of a multi-layer structure, including mid-layer 2b made of copper (Cu) or a Cu alloy, which is disposed between underlayer 2a and overlayer 2c. Underlayer 2a and overlayer 2c can be composed of a conductive material other than copper or a Cu alloy. In the illustrated embodiment of the present invention, three-layered conductive structure 2 includes a molybdenum (Mo) or Mo alloy conductive underlayer 2a, a copper (Cu) or Cu alloy conductive layer 2b, and a molybdenum nitride (MoN) overlayer 2c. However, the invention herein is not limited to the illustrated example, and structure 2 also can be a single layer of copper (Cu), or a Cu alloy, a single copper conductive layer having different compositions, or another conductive single or multi-layer structure. Also, the designations "overlayer" and "underlayer" are relative to a view of the structure and used only for the purpose of illustration, and not as an assignment of absolute orientation.

Desirably, three-layered structure 2 may be formed by sputtering. For example, lower structure 1 is placed in a sputtering reaction chamber filled with argon (Ar) gas, after which power is applied to a molybdenum target, causing molybdenum layer 2a to be deposited on lower structure 1. Next, power is removed from the molybdenum target, and is applied to a copper target causing copper layer 2b to be deposited on layer 2a. Then, the power is removed from the copper target. While the reaction chamber is supplied with a nitrogen source gas, power again is applied to a molybdenum target, causing a reaction between molybdenum and nitrogen to deposit molybdenum nitride (MoN) layer 2c. A nitrogen source gas can include, without limitation, nitrogen gas ($N_2$), nitrous oxide ($N_2O$), or ammonia ($NH_3$). It is desirable to supply a gaseous mixture of an argon (Ar) gas and a nitrogen source gas, in an approximate Ar:N ratio of 40:60. Alternatively, a nitrogen source gas may be supplied alone.

Turning to FIG. 2, three-layered structure 2 is coated with a photoresist film (not shown), made of a photoactive compound (PAC), an organic solvent, and a novolac resin or an acrylic resin. The photoresist film may include other additives, as well. The photoresist film may be coated onto structure 2, for example, by print coating, dip coating, roll coating, blade coating, or, desirably, spin coating. The photoresist film can be annealed at between about 90° C. to about 120° C. to evaporate the organic solvent, after which a photomask (not shown) is aligned on the photoresist film to define a wire structure. The photoresist film is developed by exposure to light (e.g., UV), thereby forming photoresist pattern 3 that defines a wire structure. The photoresist pattern defined on lower structure 1 is then dried, and photoresist pattern 3 is cured by a second annealing between about 110° C. to about 130° C. A subsequent stripping process of photoresist pattern 3 may be difficult, if the second annealing temperature is too high, and thus, it is desirable to adjust the second annealing temperature not to exceed about 130° C.

Referring to FIGS. 2 and 3, photoresist pattern 3 is used as an etching mask such that three-layered wire structure 2' is formed by etching three-layered structure 2. Three-layered wire structure 2' can be formed from conductive layer 2a', made of molybdenum (Mo) or a Mo alloy; conductive layer 2b' made of copper (Cu) or a Cu alloy; and conductive layer 2c', made of molybdenum nitride (MoN). Three-layered structure 2 is wet-etched using a hydrogen peroxide-containing etchant. It is advantageous to prevent lifting, peeling off, or corrosion of the copper conductive layer during etching, and to ensure a good lateral profile of a wire structure formed. Accordingly, the etchant is made of a mixture of hydrogen peroxide (between about 10 WT % to about 20 WT %); of organic acid (between about 1 WT % to about 5 WT %); of a triazole-based compound (between about 0.1 WT % to about 1 WT %); of a fluoride compound (between about 0.01 WT % to about 0.5 WT %); with the remainder being deionized water.

Figure 4:
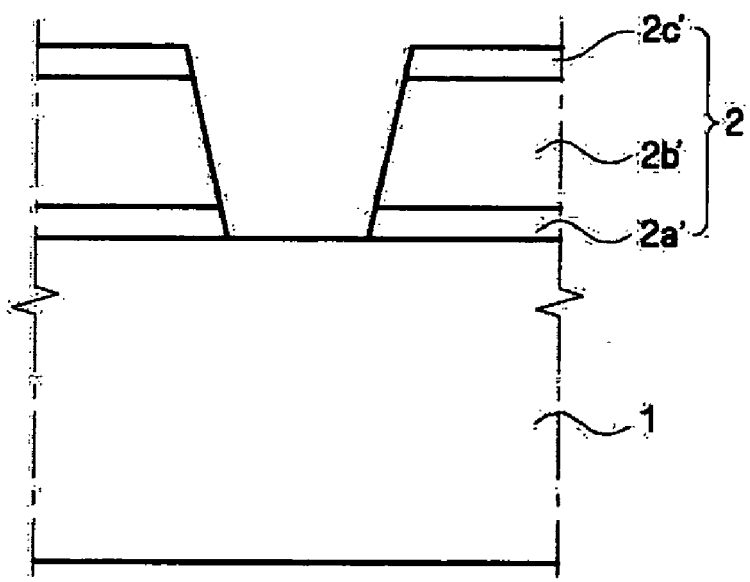
FIG. 4 is a sectional view of a wire structure formed using a method according to an embodiment of the present invention.

FIGS. 3 and 4 illustrate stripping photoresist pattern 3 using a photoresist stripper composition, according to the present invention, which composition facilitates photoresist stripping and prevents the corrosion of the three-layered wire structure 2' during the photoresist stripping. The photoresist stripper composition according to the present invention includes butyldiglycol, an alkylpyrrolidone, an organic amine compound, aminopropylmorpholine, and a mercapto compound. Butyldiglycol, in a concentration of between about 50 WT % to about 70 WT %, serves to prevent the evaporation of the photoresist stripper composition and minimizes composition changes during stripping. Also, butyldiglycol in this proportion tends to decrease the melting point of the photoresist stripper composition, thereby increasing the storage stability of the photoresist stripper composition. An alkylpyrrolidone, in a concentration of at least about 20 WT %, is used as a solvent for dissolving the photoresist, improving the wettability of the photoresist film by decreasing the surface tension of the photoresist stripper composition. To reduce costs and to maintain the efficacious concentration of other stripper composition components, it is desirable to use no more than about 40 WT % of an alkylpyrrolidone in the stripper composition. Exemplary alkylpyrrolidones include, without limitation, n-methylpyrrolidone, n-ethylpyrrolidone, n-propylpyrrolidone, n-octylpyrrolidone, n-cyclohexylpyrrolidone, 1-hydroxyethyl-2-pyrrolidone, n-dodecylpyrrolidone, 2-pyrrolidone, and 1-hydropropyl-2-pyrrolidone. However, it is believed to be advantageous to use n-methylpyrrolidone as the alkylpyrrolidone in the stripper composition. Organic amine compounds can strip a photoresist when used in a concentration of at least about 1 WT %. By using the organic amine compound in a concentration of no more than about 10 WT %, high stripping efficiency can be achieved, while substantially preventing copper conductive layer corrosion. Examples of suitable organic amine compounds include, without limitation, aliphatic amines and aromatic amines, such as monoethanol amine; monoisopropanol amine; diethanol amine; 2-amino-1-propanol; 3-amino-1-propanol; 2-amino-1-propanol; n-methyl ethanol amine; 3-ethoxypropyl amine; 2-(2-aminoethoxy)ethanol; diethylene triamine; triethylene tetramine; cyclohexylamine; hydroxylamine; hetero cyclic amine; triethanol amine; dipropanol amine; tripropanol amine; 2-(2-aminoethoxyamino)ethanol; and 2-(2-aminoethoxyamino)ethyl amine. It is desirable to use the organic amine compound, diethanol amine. Aminopropylmorpholine in a concentration of between about 1 WT % to about 5 WT % may be used to strip a photoresist by its binding with PAC of the photoresist. The mercapto compound, represented by the symbol R—SH, tends to prevent corrosion of the copper conductive layer by action of the —SH group. Here, R may be an alkyl group. The mercapto compound may be used in a concentration in a concentration of between about 0.01 WT % to about 0.5 WT %, generally based on the total weight of the photoresist stripper composition. The above-described photoresist stripper composition embodiment of the present invention exhibits a good photoresist stripping capability, and at the same time, preserves the profile of copper conductive layer 2b' by tending to weakly attack the copper conductive layer. Thus, the photoresist stripper composition of the present invention can be used to remove a photoresist film when patterning a low-resistance copper wire structure. Turning to FIG. 4, a method for stripping a photoresist film using a photoresist stripper composition embodiment of the present invention will be described. Photoresist pattern 3, formed on three-layered wire structure 2', is put into contact with the exemplary photoresist stripper composition, by dipping lower structure 1, bearing photoresist pattern 3, into the photoresist stripper composition, or by spraying the photoresist stripper composition on photoresist pattern 3. Stripper composition spraying can be advantageous to satisfy economic and efficiency needs. The contact time of the photoresist stripper composition may be appropriately adjusted in view of considerations such as photoresist stripping capability, the degree of corrosion to the three-layered wire structure 2', and so on. For example, to ensure sufficient stripping, a contact time of at least about 60 seconds may be desirable, although it may be desirable to limit contact time to no more than about 180 seconds, to combat excessive corrosion and to reduce process time. Typically, the contact temperature may be about 70° C. However, residual photoresist may be left on three-layered wire structure 2' or lower structure 1, even after the stripping of photoresist pattern 3, and thus it is desirable to perform a washing to remove the photoresist pattern residue and the photoresist stripper composition. The washing can be performed at a temperature of about 70° C. for between about 60 seconds to about 180 seconds. Amines contained in the photoresist stripper composition react with water during the washing step to form strong alkali hydroxide ions, which are corrosive to copper conductive layer 2b'. Thus, washing typically is performed in two steps: a first washing step using isopropanol, followed by a second washing step using deionized water. However, because copper conductive layer corrosion can be prevented by the mercapto compound contained in the stripper composition, that photoresist stripper composition embodiments of the present invention allow the first isopropanol washing to be skipped.

Figure 5:
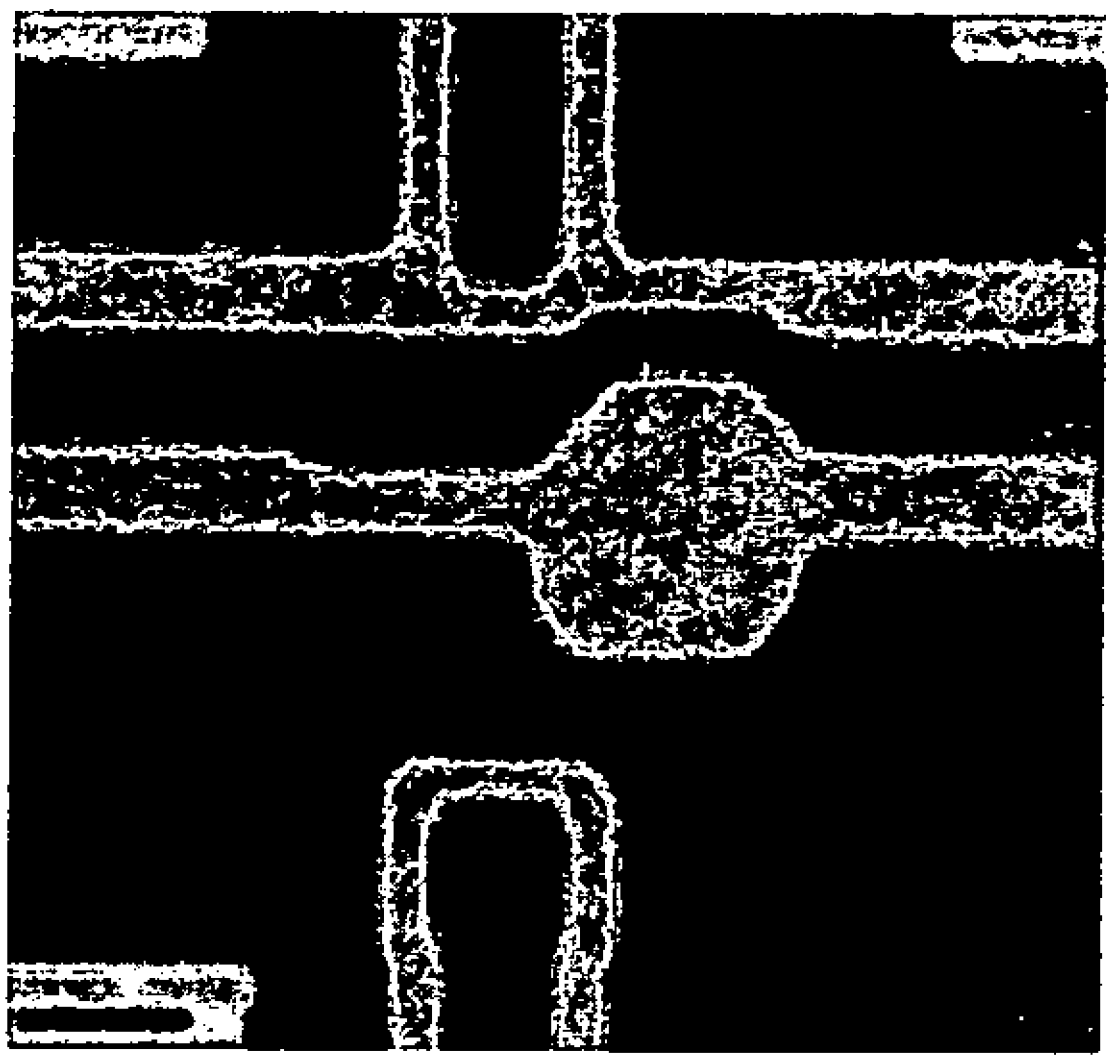
FIG. 5 is a plan image view of a wire structure formed using a method according to an embodiment of the present invention.
Figure 6A:
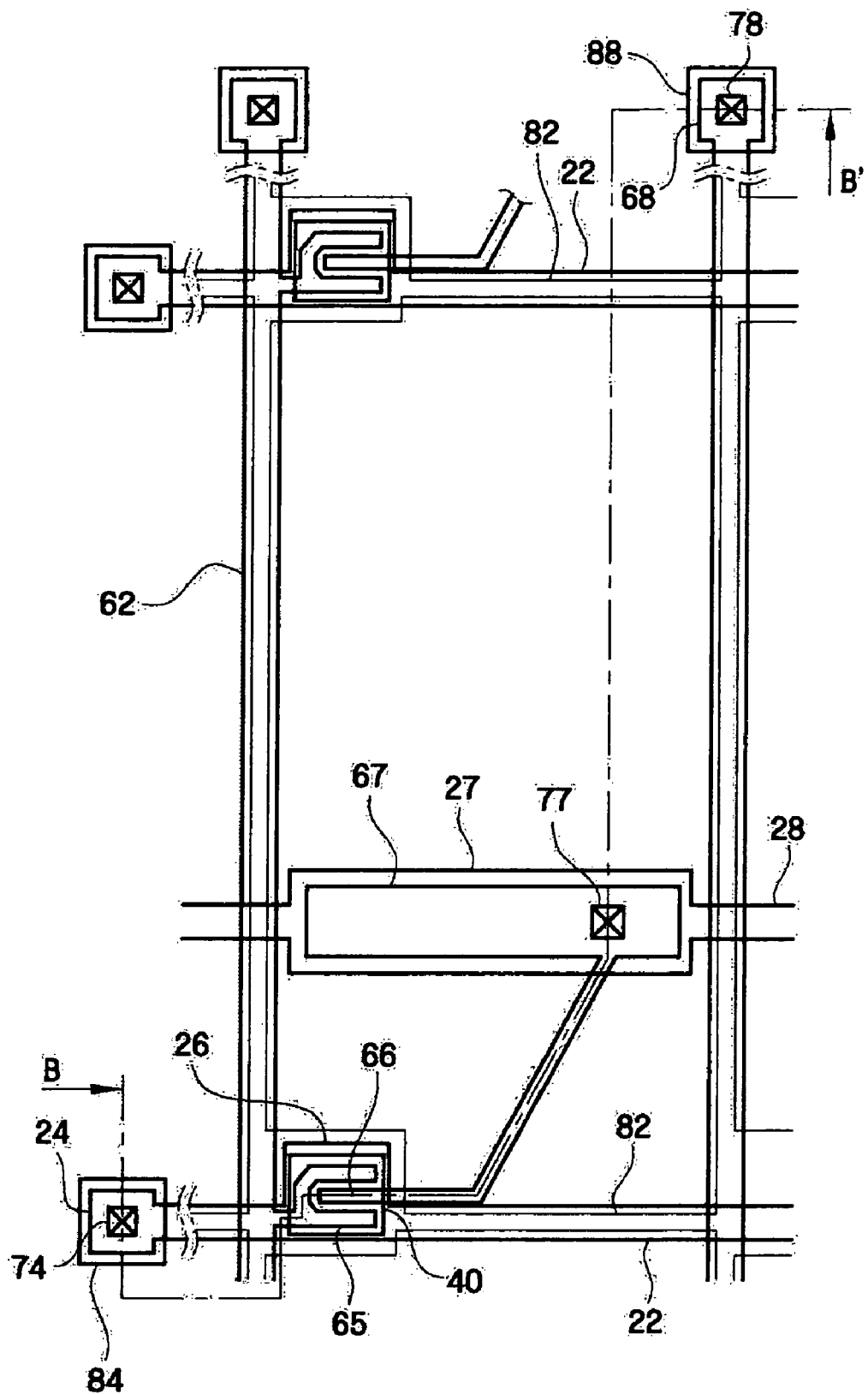
FIG. 6A is a layout of a thin film transistor substrate using a fabrication method according to an embodiment of the present invention.
Figure 6B:
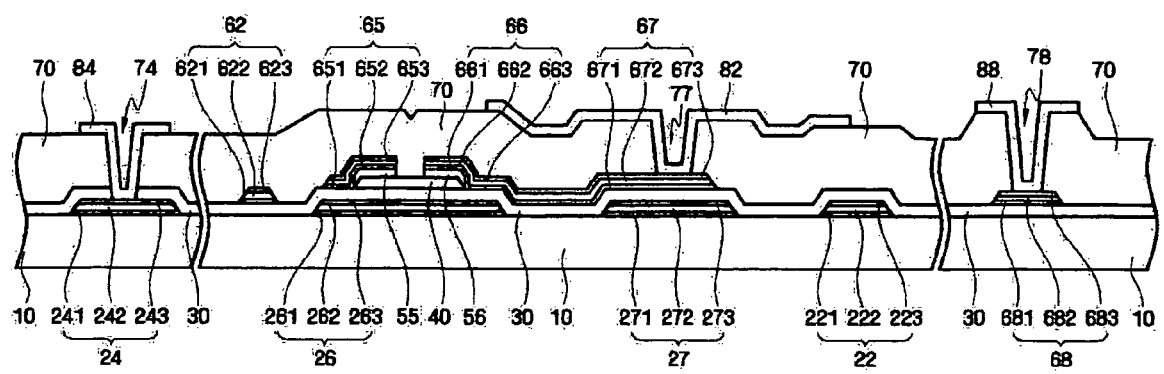
FIG. 6B is a sectional view taken along a line B-B' of FIG. 6A.

FIG. 5 is a plan image view of wire structures formed using a method for forming wire structures according to an embodiment of the present invention, in which copper wire structure photoresist patterns are depicted to be well-defined, indicating that the photoresist stripper composition according to the present invention exhibits excellent linearity and good photoresist stripping capability, while preventing copper corrosion even after the photoresist patterns are removed. The above-described wire structure and the fabrication method thereof, according to the present invention can be applied, for example, to a TFT substrate for an LCD or an organic EL display; to a semiconductor device, to a semiconductor apparatus; and to any other applications in which it is necessary to form precise wiring patterns. Although the embodiments below are described with regard to a TFT substrate, those skilled in the art would know that the invention is not limited thereto. As used herein, the term "thin film transistor" generally refers to a substrate encompassing at least one TFT, but does not preclude the intervention of another structure between the TFT and the substrate, or the presence of additional structure formed thereon. FIGS. 6A and 6B illustrate a thin film transistor substrate structure fabricated by a method for one embodiment of the present invention, in which FIG. 6A is a layout of a fabricated thin film transistor substrate structure. In FIGS. 6A and 6B, a plurality of gate wire structures for gate signal transmission are disposed on insulating substrate 10. Gate wire structures (22, 24, 26, 27, 28) include gate line 22 extending in a transverse direction; gate pad 24 connected to an end of gate line 22; TFT gate electrode 26; storage electrode 27; and storage electrode line 28, parallel to gate line 22. Gate pad 24 receives a gate signal from an external source and transmits the received gate signal to gate line 22. Gate electrode 26 is connected to the gate line 22, and is formed with a protrusion shape. Storage electrode line 28 extends in a transverse direction across a pixel region and is connected to storage electrode 27 that is wider than storage electrode line 28. Storage electrode 27 overlapping with drain electrode extension portion 67 connected with pixel electrode 82 forms a storage capacitor that enhances a charge storage capacity of a pixel. Exemplary gate wire structure (22, 24, 26, 27, 28) is disposed on substrate 10, and has a three-layered structure composed of a molybdenum layer (221, 241, 261, 271), a copper layer (222, 242, 262, 272), and a molybdenum nitride layer (223, 243, 263, 273). Although not directly shown, the storage electrode line 28 also has a three-layered structure, which is substantially the same as gate wire structure (22, 24, 26, 27). After gate wire structure (22, 24, 26, 27, 28) is formed on substrate 10, then gate insulating layer 30 made of silicon nitride (SiNx) or the like is disposed on gate wire structure (22, 24, 26, 27, 28) and substrate 10. An island-shaped semiconductor layer 40, made of a semiconductor such as hydrogenated amorphous silicon, is disposed on a portion of gate insulating layer 30 corresponding to the gate electrode 26. Ohmic contact layers 55 and 56, made of n+ hydrogenated amorphous silicon, and heavily doped with an n-type impurity, are disposed on the semiconductor layer 40. Data wire structure (62, 65, 66, 67, 68) is disposed on the ohmic contact layers 55 and 56, and the gate insulating layer 30. Data wire structure (62, 65, 66, 67, 68) includes a data line 62 substantially extending in a longitudinal direction and intersecting a gate line 22 to define pixels; a source electrode 65 connected to the data line 62 and extending over the ohmic contact layer 55; a data pad 68 connected to an end of the data line 62 and receiving a picture signal from external circuits; a drain electrode 66 spaced apart from the source electrode 65; and a drain electrode extension portion 67 extending from the drain electrode 66 and having a large area overlapping with the storage electrode 27. Drain electrode 66 is formed on ohmic contact layer 56 and disposed to in opposition to the source electrode 65 relative to the gate electrode 26, Data wire structure (62, 65, 66, 67, 68) has a three-layered structure composed of a molybdenum layer (621, 651, 661, 671, 681), a copper layer (622, 652, 662, 672, 682), and a molybdenum nitride layer (623, 653, 663, 673, 683). Source electrode 65 overlaps with at least a portion of semiconductor layer 40. Drain electrode 66 is in opposition to source electrode 65, with respect to gate electrode 26, and overlaps with at least a portion of semiconductor layer 40. Ohmic contact layers 55 and 56 are disposed between underlying semiconductor layer 40, and overlying source electrode 65 and drain electrode 66 to reduce the contact resistance therebetween. Drain electrode extension portion 67 overlaps with storage electrode 27 to form a sustain capacitor, with gate insulating layer 30 being interposed between drain electrode extension portion 67 and storage electrode 27. In this example, constituent components of a TFT include gate electrode 26, ohmic contact layers 55 and 56, source electrode 65, and drain electrode 66. Semiconductor layer 40 constitutes a channel portion of the TFT. In the illustrated embodiment of the present invention, a bottom gate-type TFT is provided where the gate electrode 26 is formed under the semiconductor layer 40, including the channel portion of layer 40. Passivation layer 70 is disposed on the data wire structure (62, 65, 66, 67, 68), and on those portions of semiconductor layer 40 that remain exposed adjacent to source electrode 65 and drain electrode 66. Desirably, passivation layer 70 is made of a photosensitive organic insulating material having a good flatness characteristic and a low dielectric constant, such as an a-Si:C:O material and an a-Si:O:F material, which may be formed by plasma enhanced chemical vapor deposition (PECVD). Passivation layer 70 also may be made of an inorganic insulator, such as silicon nitride. Contact holes 77 and 78 penetrate passivation layer 70 to expose drain electrode extension portion 67 and data pad 68, respectively, and contact hole 74 exposing the gate pad 24 is formed to penetrate passivation layer 70 and gate insulating layer 30. Pixel electrode 82 is electrically connected to drain electrode 66 via contact hole 77, and is disposed on a portion of passivation layer 70 corresponding to each pixel. When a data voltage is applied across the common electrode of an upper display substrate and pixel electrode 82, the electric fields generated typically determine an orientation of liquid crystal molecules in the liquid crystal layer therebetween. Also disposed on the passivation layer 70 are auxiliary gate pad 84 and auxiliary data pad 88. Pad 84 is connected to gate pad 24 via contact hole 74, and pad 88 is connected to data pad 68 via contact hole 78. Desirably, pixel electrode 82, auxiliary gate pad 86, auxiliary data pad 88, are made of a transparent conductor, such as ITO.

Figure 7A:
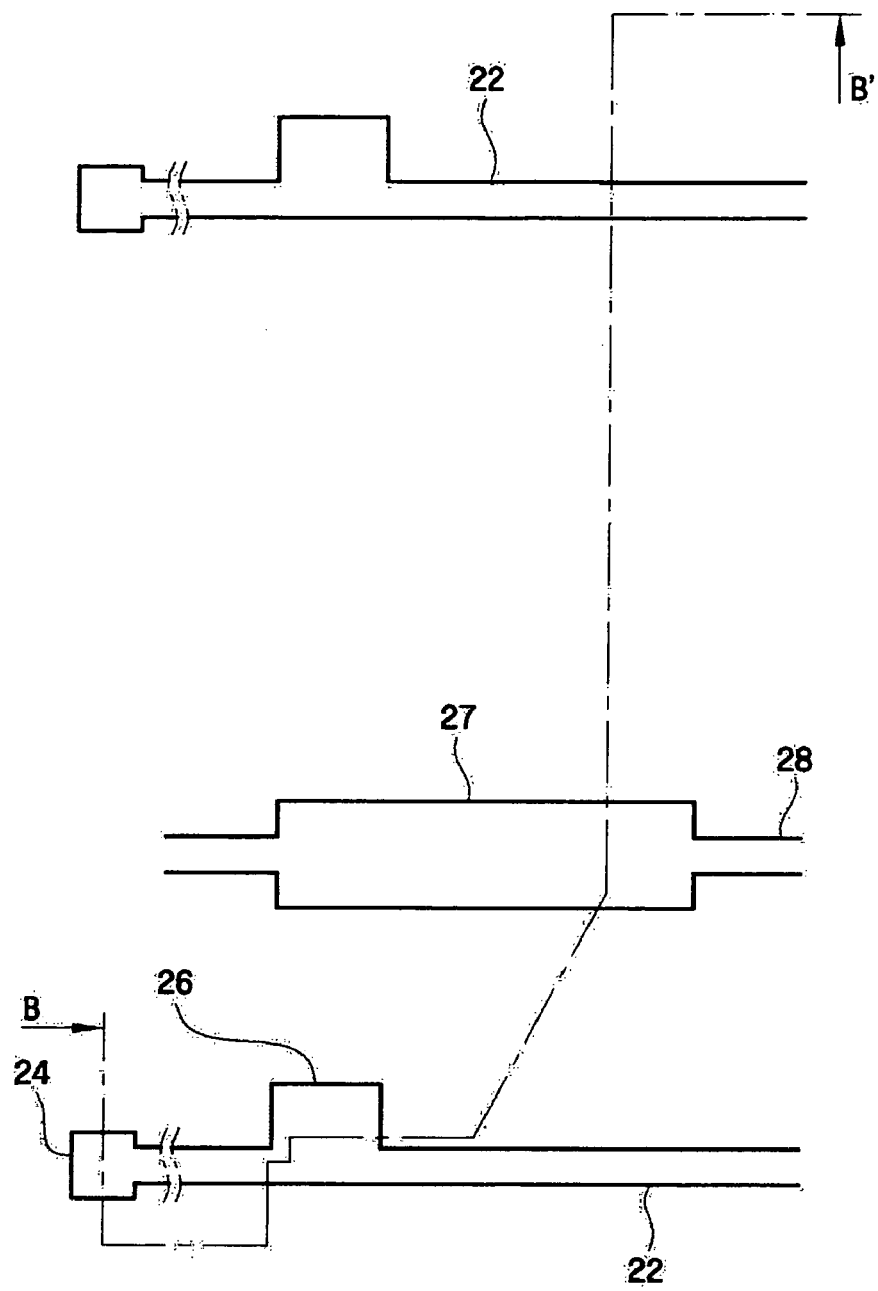
FIGS. 7A, 9A, 10A, and 11A are sequential layouts illustrating a method for fabricating a thin film transistor substrate according to an embodiment of the present invention.
Figure 7B:
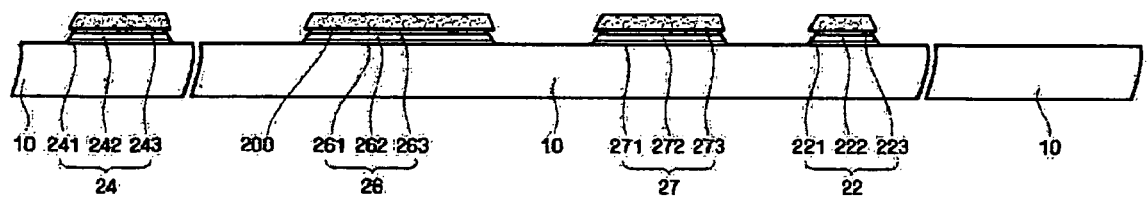
FIGS. 7B and 8 are sequential sectional views taken along a line B-B' of FIG. 7A.
Figure 8:
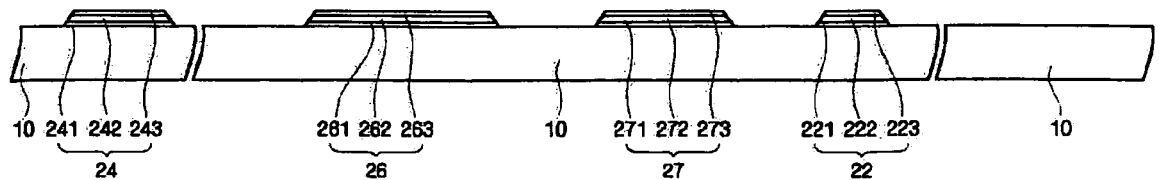

FIGS. 6A, 6B, and 7A through 11B illustrate an embodiment of the present invention providing a method for fabricating the above-described thin film transistor substrate. One of ordinary skill in the art would readily be able to apply the foregoing teachings relating to present inventive method embodiments for forming a wire structure to method embodiments for fabricating the above-described thin film transistor substrate. Thus, details understood as duplicative to the skilled artisan may not be explicitly recited. Referring to FIGS. 7A and 7B, a first layer of molybdenum or a molybdenum alloy, a second layer of copper or a copper alloy, and a third layer of molybdenum nitride are deposited sequentially on an insulating substrate 10, for example, using sputtering techniques, to form a three-layered gate structure. To define the gate wire structure, photoresist pattern 200 is formed from a photoresist film coated on the three-layered gate structure, which film is exposed to light and developed. The three-layered wire structure is produced when gate structure is etched, desirably using an etching solution and a wet-etching technique, with photoresist pattern 200 serving as an etching mask. FIGS. 7B and 8 illustrate the removal of photoresist pattern 200 using a photoresist stripper composition according to the present invention, composed of butyldiglycol, an alkylpyrrolidone, an organic amine compound, aminopropylmorpholine, and a mercapto compound. The photoresist stripper composition and photoresist pattern residue are washed by spraying with ultra-purified water, exposing the formed gate wire structure (22, 24, 26, 27, 28). As shown in FIGS. 7A and 8, gate wire structure (22, 24, 26, 27, 28), which is formed in accordance with an embodiment of the present invention, includes gate line 22, a gate electrode 26, a gate pad 24, a storage electrode 27, and a storage electrode line 28. Thus formed, gate wire structure (22, 24, 26, 27, 28) includes copper conductive layer (222, 242, 262, 272) which even after wet etching and the removal of the photoresist pattern 200, remains well adhered to the underlying lower structure, and which presents lateral profile exhibiting a good taper angle without overhang.

Figure 9A:
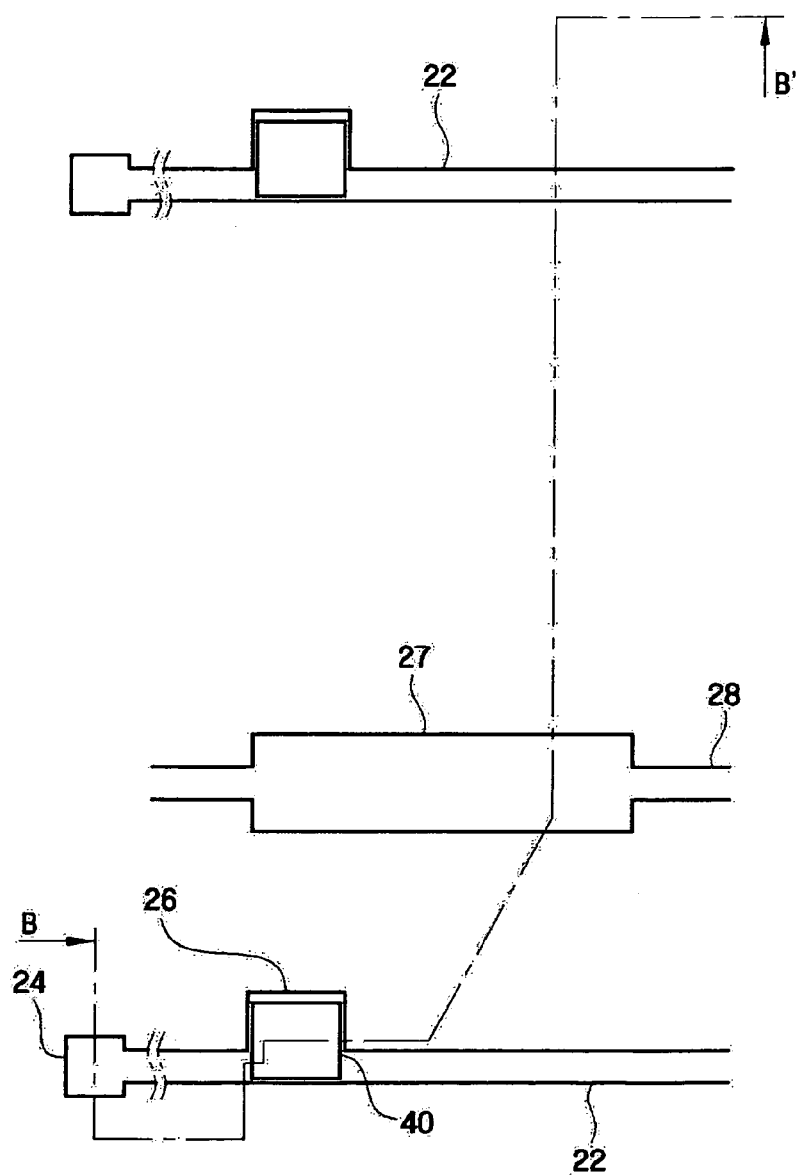
Figure 9B:
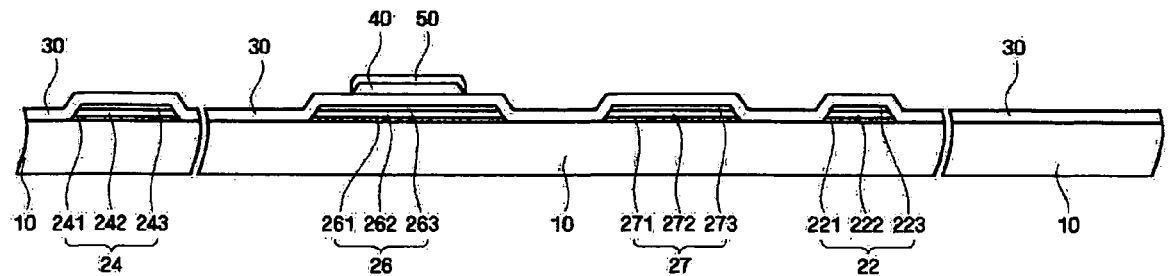
FIGS. 9B, 10B, and 11B are sequential sectional views taken along lines B-B' of FIGS. 9A, 10A, and 11A, respectively.
Figure 10A:
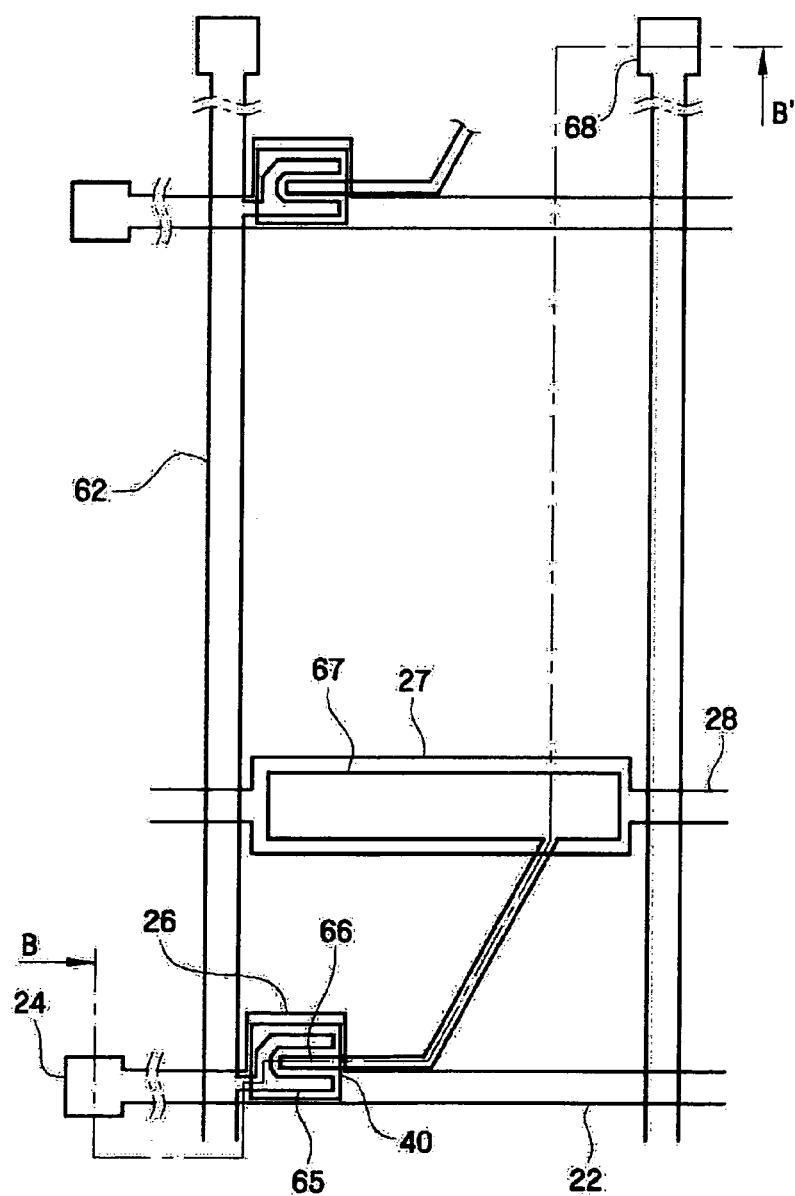
Figure 10B:
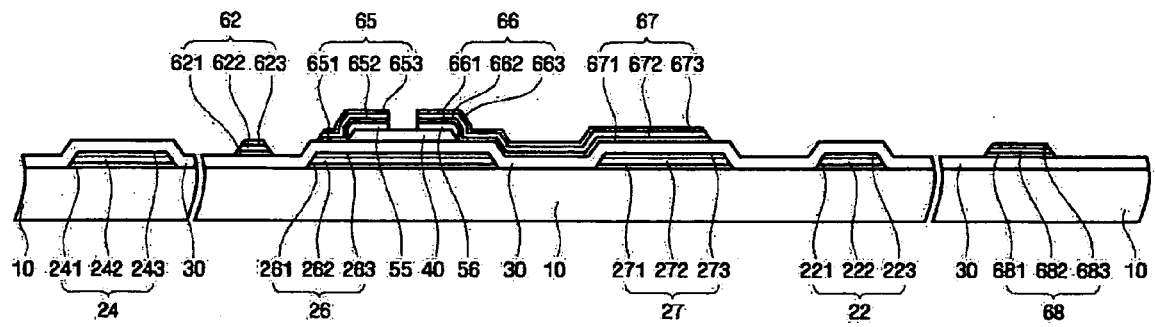
Figure 11A:
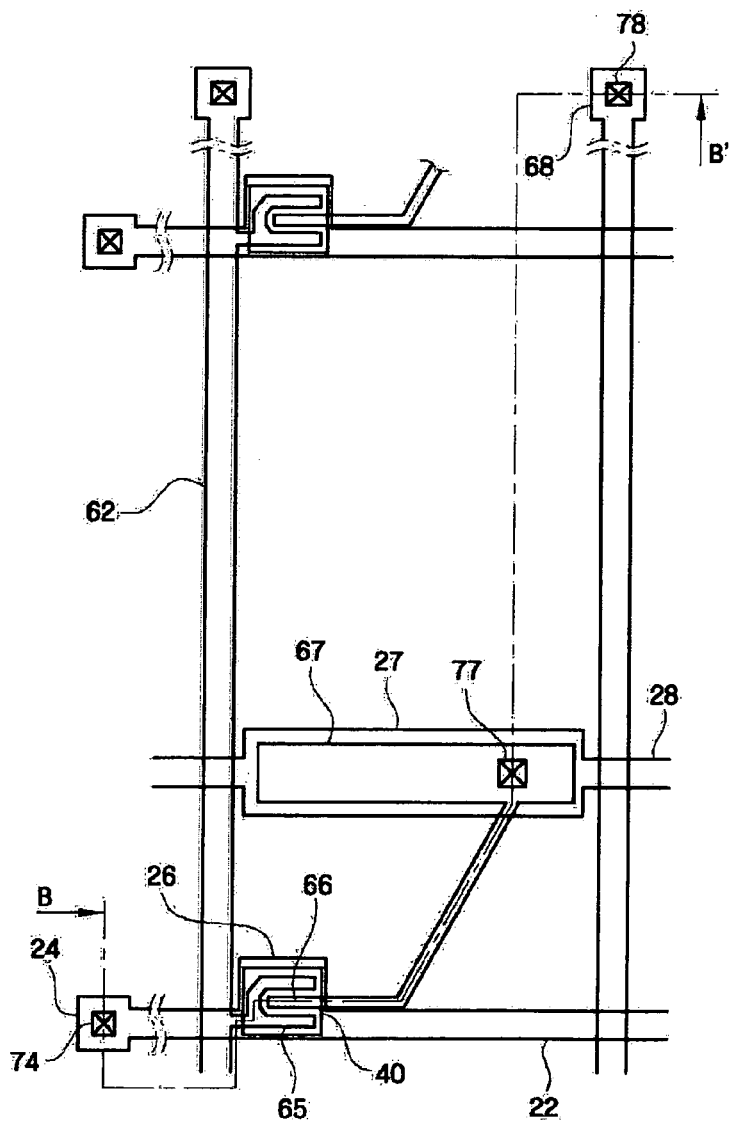
Figure 11B:
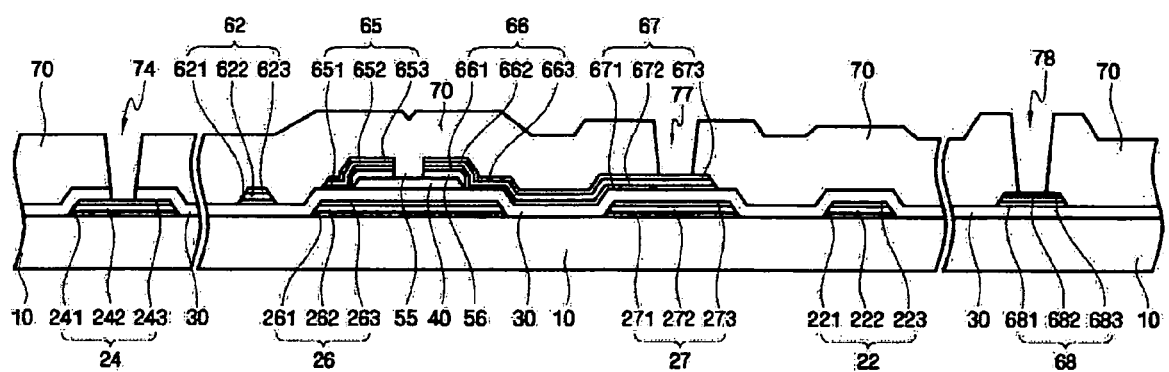

FIGS. 9A and 9B illustrate the formation of gate insulating layer 30 made of silicon nitride, upon which is sequentially formed an intrinsic amorphous silicon layer, and a doped amorphous silicon layer. The layers, including layer 30, can be continuously deposited using, for example, chemical vapor deposition (CVD). The intrinsic amorphous silicon layer and the doped amorphous silicon layer are etched using photolithography to form on gate insulating layer 30, respectively, island-shaped semiconductor layer 40 and doped amorphous silicon layer pattern 50, which corresponds to gate electrode 26. FIGS. 10A and 10B, illustrate the formation of a three-layered data structure generally composed of a molybdenum layer, a copper layer, and a molybdenum nitride layer. Upon gate insulating layer 30 and doped amorphous silicon layer pattern 50 can be sequentially deposited a layer of molybdenum or molybdenum alloy, a layer of copper or copper alloy, and a layer of molybdenum nitride. Sequential deposition may be made, for example, by sputtering. Then, in a manner similar to the above-described formation of the gate wire structure, the three-layered data wire structure can be coated with a photoresist film, exposed to light, and developed to form a photoresist pattern defining the data wire substructure. The photoresist pattern can serve as a mask during an etch of the three-layered data structure. The photoresist pattern then is removed using a photoresist stripper composition according to the present invention, that is, a stripper composition including butyldiglycol, an alkylpyrrolidone, an organic amine compound, aminopropylmorpholine, and a mercapto compound, and the resulting structure is washed with deionized water. In this way, data wire structure (62, 65, 66, 67, 68) is formed to include data line 62; intersecting with the gate line 22; source electrode 65, connected to the data line 62 and partially overlapping with the gate electrode 26; data pad 68, connected to an end of the data line 62; drain electrode 66 in opposition with and separated from the source electrode 65, with respect to the gate electrode 26; and a large-area drain electrode extension portion 67, which extends from drain electrode 66 and which overlaps with storage electrode 27. As described above with reference to FIG. 5, the photoresist stripper composition of the present invention, provides good photoresist stripping capability, and is capable of preventing corrosion of the copper-containing layers of three-layered data wire structure (62, 65, 66, 67, 68), even after removal of photoresist pattern 200, so that data wire structure (62, 65, 66, 67, 68) can maintain low resistance and can exhibit excellent linearity. Ohmic contact layers 55 and 56 may be etched from a portion of the doped amorphous silicon layer pattern 50, exposed through the source electrode 65 and the drain electrode 66. Therefore, the source and drain electrodes 65 and 66 are separated with respect to the gate electrode 26, leaving a portion of the semiconductor layer 40 exposed. FIGS. 11A and 11B illustrate that passivation layer 70 can be formed of one or more layers of insulating materials. When an organic insulating material is used, it is desirable that the material exhibit superior flatness properties and photosensitivity. Also, when an insulating material is used, it is desirable to employ one or more layers of a material having a low dielectric constant and formed by plasma enhanced chemical vapor deposition (PECVD), such as a-Si:C:O material or a-Si:O:F material. Alternatively, an inorganic material such as SiNx may be used. Passivation layer 70 and gate insulating layer 30 are patterned using photolithography to form contact holes 74, 77, and 78 which, in turn, can be used to expose gate pad 24, drain electrode extension portion 67, and data pad 68, respectively. Referring again to FIGS. 6A and 6B, an indium tin oxide (ITO) film is deposited and etched using photolithography to form the pixel electrode 82, which is connected to the drain electrode 66 via contact hole 77. Also formed are auxiliary gate pad 84, connected to the gate pad 24 via contact hole 74; and auxiliary data pad 88, connected to data pad 68 via the contact hole 78. While the foregoing illustrated examples have shown that the semiconductor layers and the data wire structures herein may be formed by photolithography using different masks, the present invention can also be applied to a TFT substrate having semiconductor layers and wire structures whose patterns are substantially similar. Accordingly, a method for fabricating the TFT substrate thereof will be described with reference to FIGS. 12A and 12B.

Figure 12A:
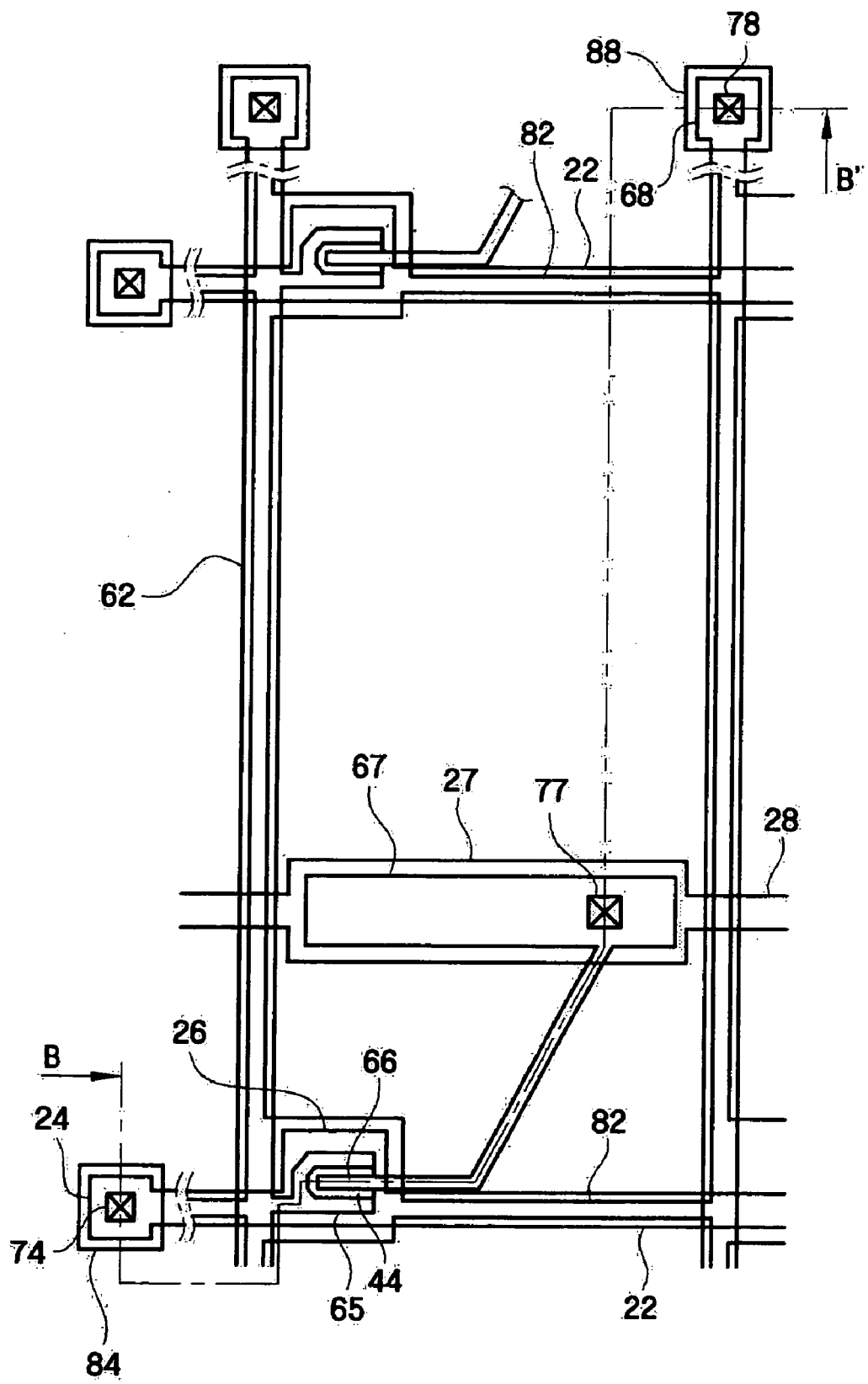
FIG. 12A is a layout of an example of a thin film transistor substrate fabricated according to an embodiment of the present invention.
Figure 12B:
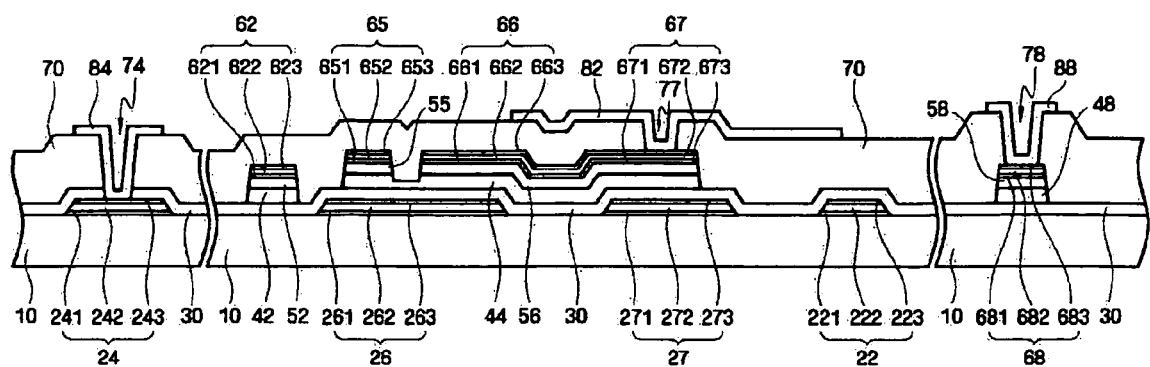
FIG. 12B is a sectional view taken along a line B-B' of FIG. 12A.

FIG. 12A is an exemplary layout of a thin film transistor substrate similar to the embodiment shown in, and described with respect to, FIGS. 6A and 6B. FIG. 12B is a sectional view of the TFT substrate, taken along a line B-B' of FIG. 12A. Because the thin film transistor substrate illustrated in FIGS. 12A and 12B has substantially the same structure as that illustrated in FIGS. 6A and 6B, except that it is advantageous to form semiconductor layers 42, 44, and 48 (except a portion of the semiconductor layer 44 forming a channel region), and ohmic contact layers 52, 55, 56, and 58 in substantially the same patterns as those used in data wire structure (62, 65, 66, 67, 68). Embodiments of the TFT substrate fabrication method according to the present invention, permit a semiconductor layer and a data wire structure to be formed using single mask or, alternatively, using different masks. Where the semiconductor layer, and the data wire structure, are patterned using a single mask, it may be expedient to use a slit or semi-permeable membrane, as well. In view of the foregoing teachings, one skilled in the art can ready practice other steps, techniques, and processes that are the same as, or are substantially similar to, those embodiments of the present invention relating to the disclosed TFT substrate and fabrication methods thereof.

Figure 13A:
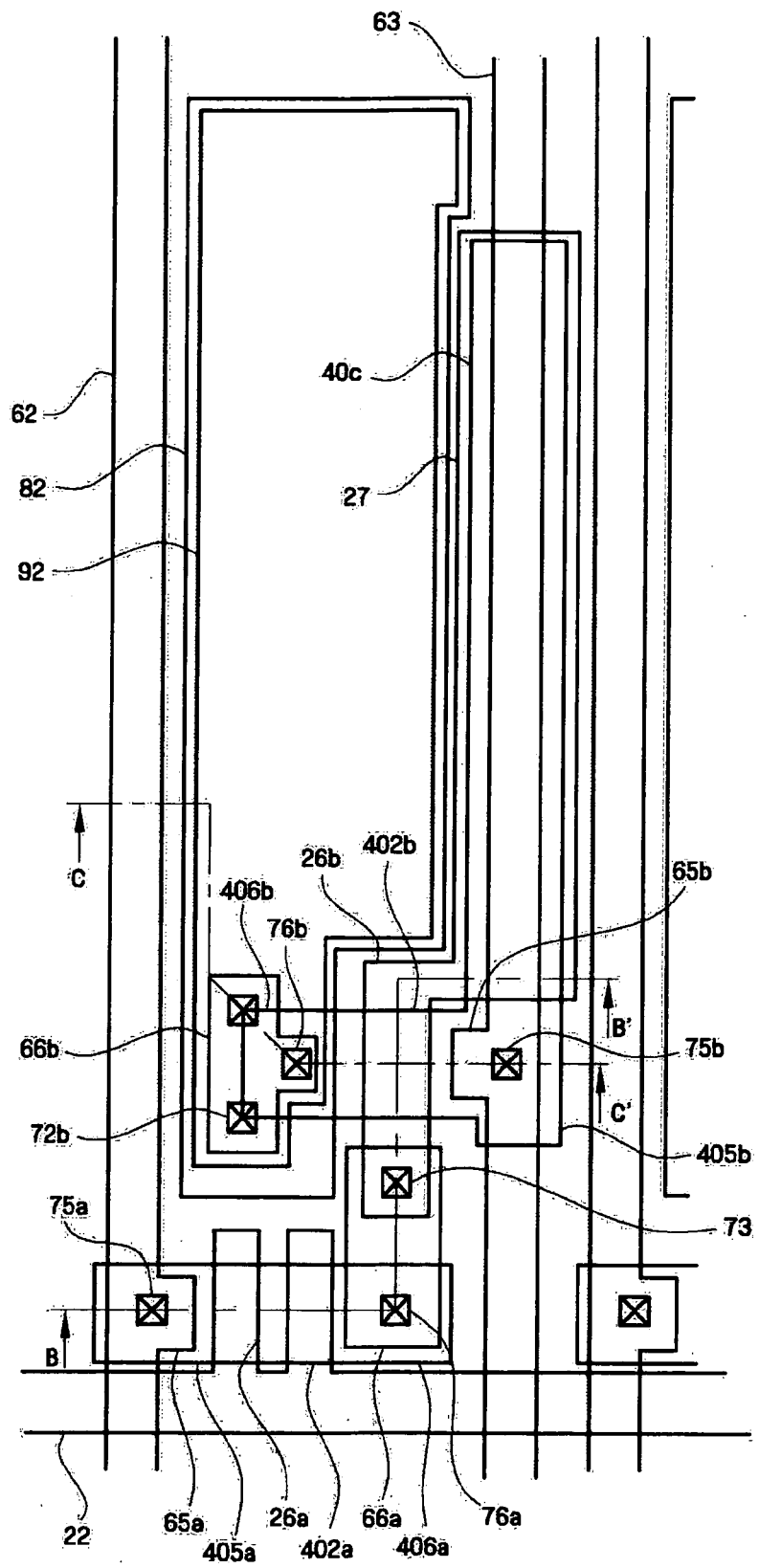
FIG. 13A is a layout of a thin film transistor substrate fabricated using a method for fabricating a thin film transistor substrate according to an embodiment of the present invention.
Figure 13B:
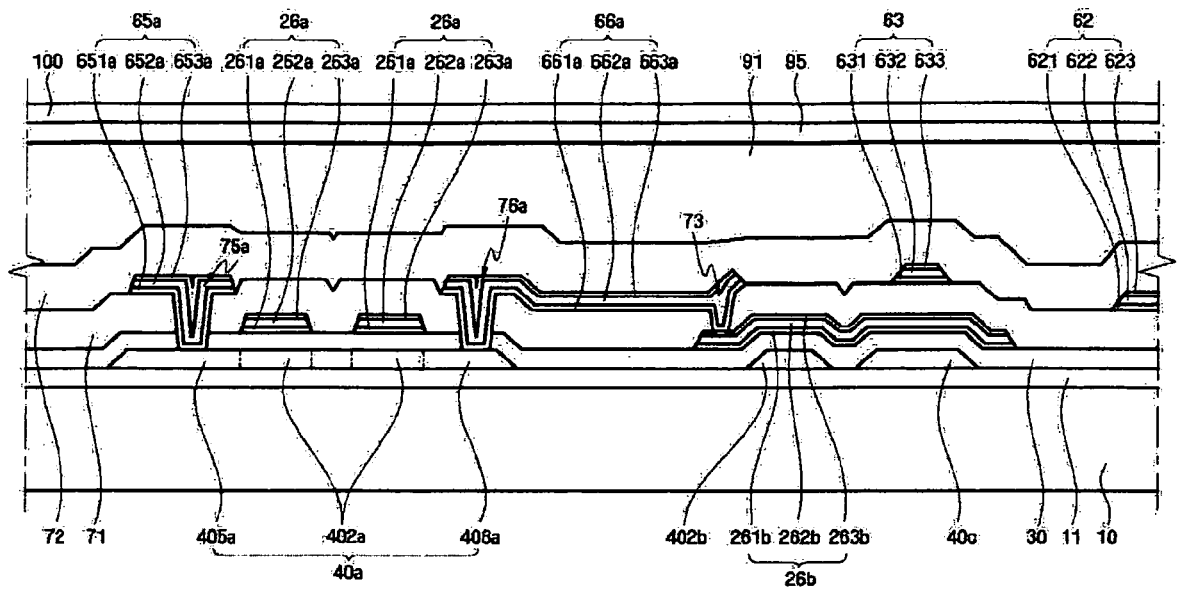
FIGS. 13B and 13C are respective sectional views taken along a line B-B' and a line C-C' of FIG. 13A.
Figure 13C:
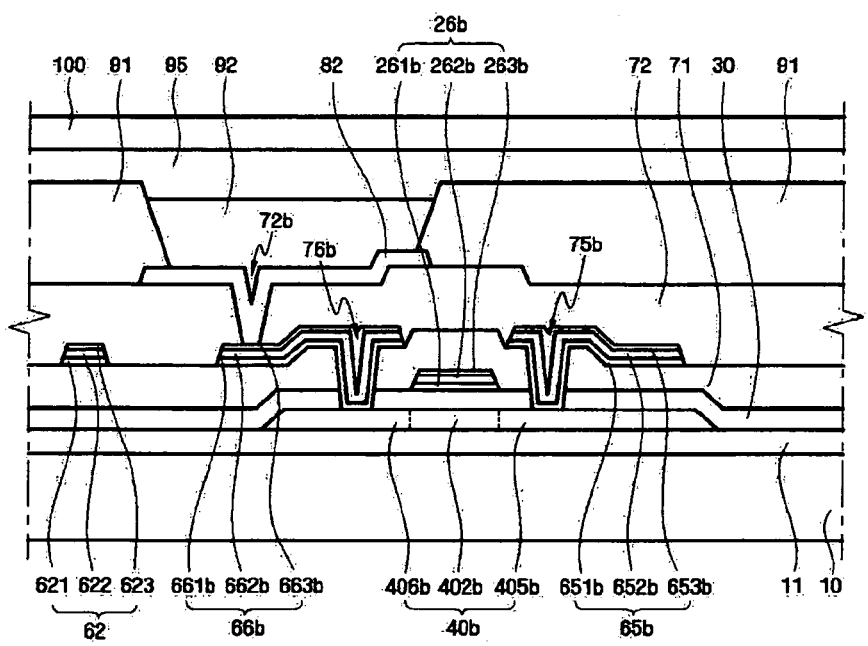

FIGS. 13A-13C illustrate method embodiments according to the present invention for fabricating a thin film transistor substrate, which may be used, for example, in an organic electroluminescent (EL) display. FIG. 13A is an exemplary layout of a fabricated thin film transistor substrate, with FIGS. 13B and 13C being respective sectional views taken along line B-B' and line C-C' of FIG. 13A. Referring to FIGS. 13A through 13C, an exemplary structure of a thin film transistor substrate fabricated according to embodiments of the present invention are described, with blocking layer 11 being disposed on an insulating substrate 10 and made of silicon oxide or silicon nitride. First semiconductor layer 40a and second semiconductor layer 40b are disposed on the blocking layer 11 and can be made of, for example, polycrystalline silicon. Second semiconductor layer 40b is connected to capacitor semiconductor layer 40c, which also may be made of polycrystalline silicon. First semiconductor layer 40a includes first thin film transistor (TFT) portions 405a, 406a, and 402a; and the second semiconductor layer 40b includes second thin film transistor (TFT) portions 405b, 406b, and 402b. TFT portion 405a, hereinafter designated as first source region, and TFT portion 406a, hereinafter designated as first drain region, are doped with n-type impurities. Similarly TFT portion 405b, hereinafter designated as second source region, and TFT portion 406b, hereinafter designated as second drain region, are doped with p-type impurities. Alternatively, first source region 405a and first drain region 406a may be doped with p-type impurities; and second source region 405b and second drain region 406b may be doped with n-type impurities. Gate insulating layer 30 made of, for example, silicon oxide or silicon nitride, can be disposed on the semiconductor layers 40a, 40b, and 40c. On the gate insulating layer 30, there are disposed gate wire structure (22, 26a, 26b, 27), including gate line 22 extending in a transverse direction; first gate electrode 26a, connected to the gate line 22; second gate electrode 26b, isolated from gate line 22 and overlapping with channel region 402b of a second TFT; and a storage electrode 27, connected to the second gate electrode 26b and overlapping with the underlying capacitor semiconductor layer 40c. Electrode 26a has a protrusion shape and overlaps with channel region 402a of a first TFT. Gate wire structure (22, 26a, 26b, 27) has a three-layered structure composed generally of a molybdenum layer (261a, 261b, 271), a copper layer (262a, 262b, 272), and a molybdenum nitride layer (263a, 263b, 273). Although not directly shown, the gate line 22 may have a structure substantially the same as multi-layered gate wire structure (26a, 26b, 27). Gate wire structure (22, 26a, 26b, 27) is disposed on gate insulating layer 30, and first interlayer insulating layer 71 is disposed on structure (22, 26a, 26b, 27) and on layer 30. On first interlayer insulating layer 71 is formed data wire structure (62, 63, 65a, 65b, 66a, 66b), which includes data line 62 extending in a longitudinal direction and intersecting gate line 22, thereby defining pixels; driving voltage line 63, supplying a driving voltage; first source electrode 65a, connected to first source region 405a through contact hole 75a, as a branch of the data line 62; first drain electrode 66a, spaced apart from first source electrode 65a and connected to first drain region 406a; second source electrode 65b, connected to second source region 406a through contact hole 75b, as a branch of driving voltage line 63; and second drain electrode 66b, spaced apart from the second source electrode 65b and connected to the second drain region 406b. Contact hole 76a is used to pass through the first interlayer insulating layer 71 and the gate insulating layer 30 and to electrically connect first drain electrode 66a to first drain region 406a. Similarly, contact hole 73 is used to pass through the first interlayer insulating layer 71 and to electrically connect first drain electrode 66a to second gate electrode 26b. Contact hole 76b passes through first interlayer insulating layer 71 and gate insulating layer 30 and is used to electrically connect second drain electrode 66b with second drain region 406b. Data wire structure (62, 63, 65a, 65b, 66a, 66b), like the gate wire structure (22, 26a, 26b, 27), has a three-layered structure composed of a molybdenum layer (621, 631, 651a, 651b, 661a, 661b), a copper layer (622, 632, 652a, 652b, 662a, 662b), and a molybdenum nitride layer (623, 633, 653a, 653b, 663a, 663b). Here, semiconductor layer 40a, first gate electrode 26a, first source electrode 65a and first drain electrode 66a, constitute a first TFT; semiconductor layer 40b, second gate electrode 26b, second source electrode 65b, and second drain electrode 66b constitute a second TFT. The first TFT can be a switching TFT, and the second TFT can be a driving TFT. First and second TFTs can be of a top gate-type TFT, where gate electrodes 26a and 26b are formed over the semiconductor layers 40a and 40b, and which includes channel portions 402a and 402b, respectively. A second interlayer insulating layer 72 can be disposed on data wire structure (62, 63, 65a, 65b, 66a, 66b), and made of, for example, silicon nitride, silicon oxide, or an organic insulating material. Second interlayer insulating layer 72 includes contact hole 72b, thereby exposing the second drain electrode 66b. Pixel electrode 82 is disposed on the second interlayer insulating layer 72, and is connected to the second drain electrode 66b via the contact hole 72b. Desirably, pixel electrode 82 is made of a high reflectivity material such as Aluminum (Al), an Al alloy, Silver (Ag), or an Ag alloy. When beneficial, pixel electrode 82 may be made of a transparent conductive material such as ITO or IZO, with the material forming the pixel electrode 82 being appropriately selected according to whether the display device is of a bottom emission type or a top emission type. In a bottom emission type of display, a picture is displayed downward relative to the TFT substrate; conversely, in a top emission type of display, a picture is displayed upward relative to the TFT substrate.

Partition wall 91, made of an organic insulating material, is formed on second interlayer insulating layer 72 to separate organic light emitting cells. Partition wall 91 is formed by exposing and developing a photosensitive agent, including a black pigment, to serve as a blocking layer and to simplify the formation process of partition wall 91. Organic light emitting layer 92 is formed in a region on pixel electrode 82 surrounded by partition wall 91. Organic light emitting layer 92 is made of organic layers that emit one of red, green, and blue, with the red, green, and blue organic light emitting layer 92 being arranged sequentially repetitively. Buffer layer 95 is disposed on organic light-emitting layer 92 and partition wall 91, although it may be possible to omit buffer layer 95. Common electrode 100 may be formed on buffer layer 95, and can be made of a transparent conductive material such as ITO or IZO. It may be advantageous to make common electrode 100 of a high reflectivity material such as Al, an Al alloy, Ag, or an Ag alloy, when the pixel electrode 82 is made of a transparent conductive material such as ITO or IZO. Other embodiments of the present invention described in the context of a TFT substrate also can be applied to an organic EL display device.

Figure 14A:
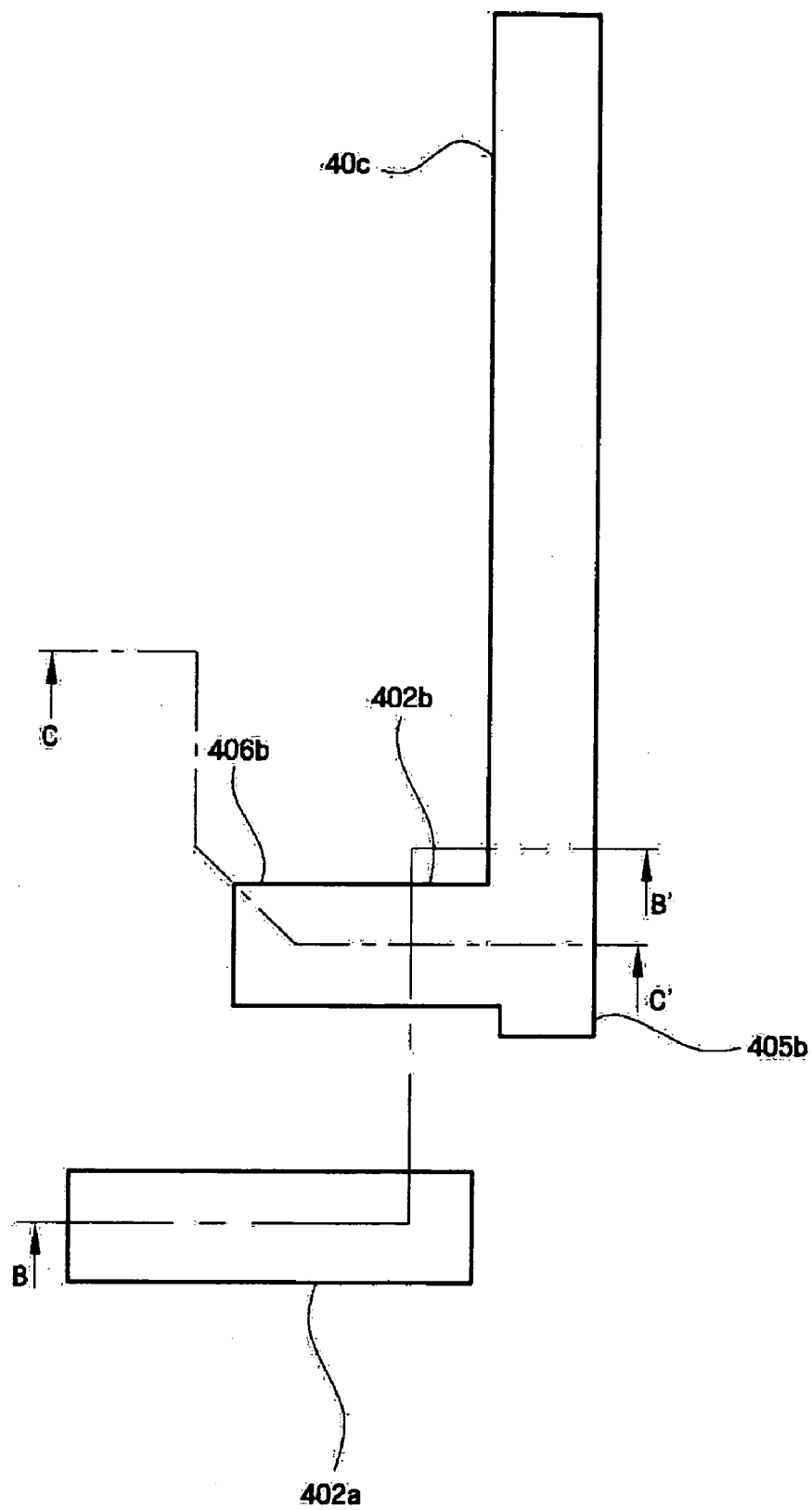
FIGS. 14A, 15A, 16A, 17A, 18A, and 19A are sequential layouts illustrating a thin film transistor substrate fabrication method, according to an embodiment of the present invention.
Figure 14B:
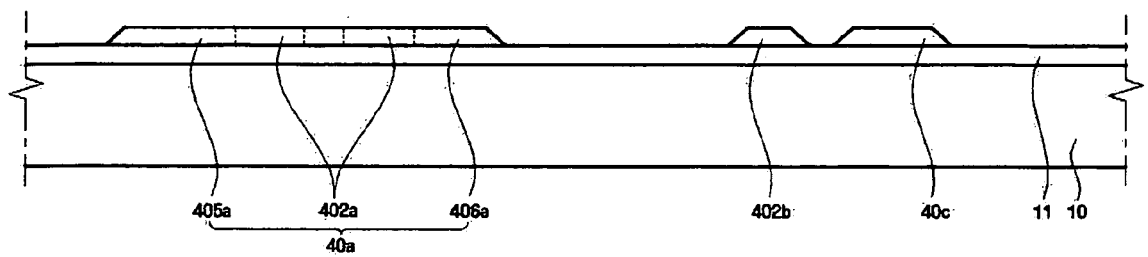
FIGS. 14B, 15B, 16B, 17B, 18B, and 19B are sequential sectional views taken along lines B-B' of FIGS. 14A, 15A, 16A, 17A, 18A, and 19A, respectively.
Figure 14C:
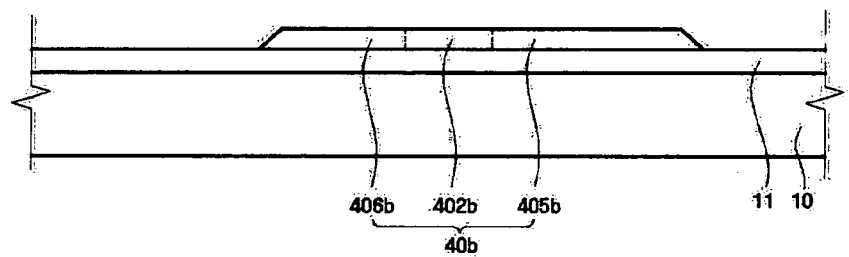
FIGS. 14C, 15C, 16C, 17C, 18C, and 19C are sequential sectional views taken along lines C-C' of FIGS. 14A, 15A, 16A, 17A, 18A, and 19A, respectively.
Figure 15A:
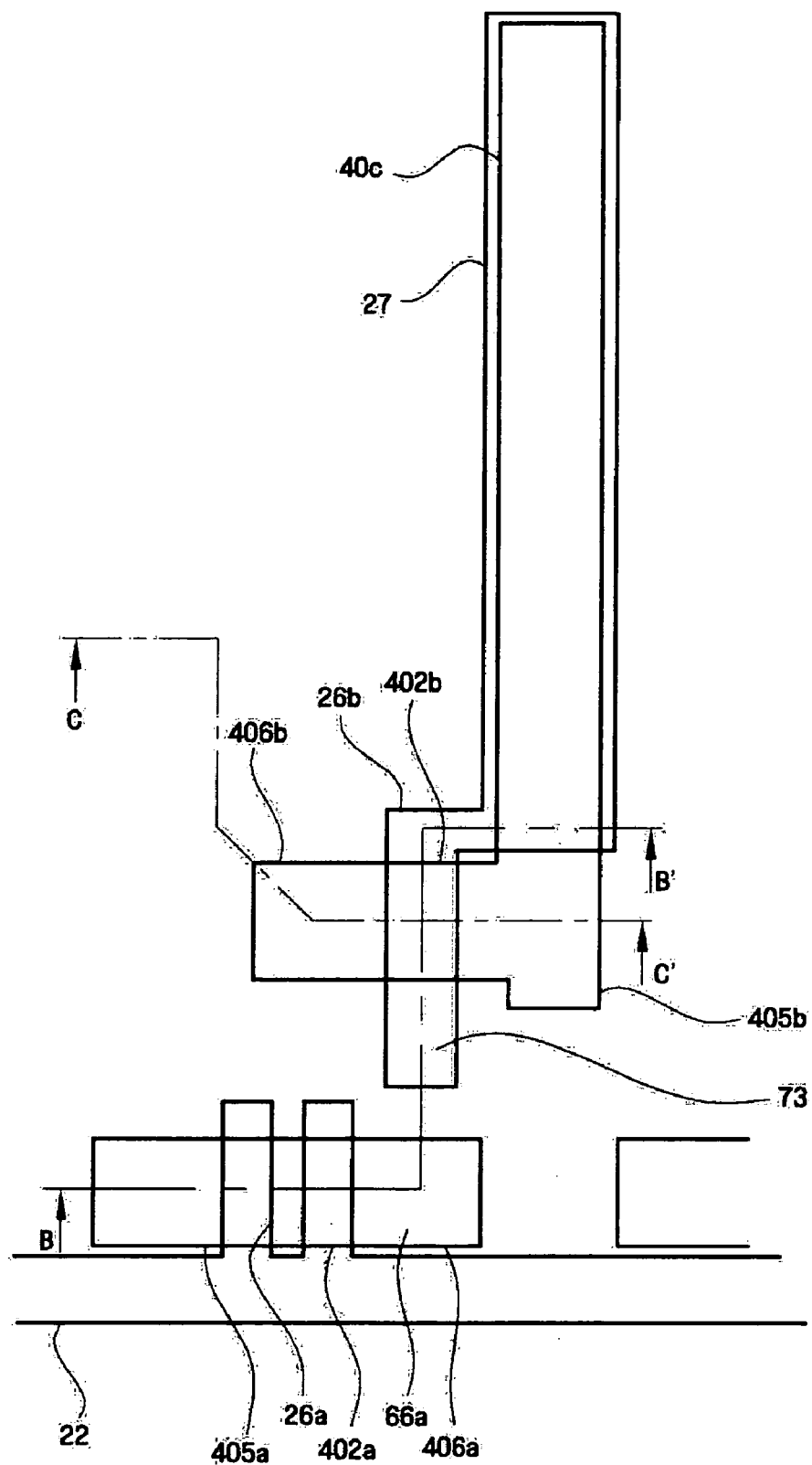
Figure 15B:
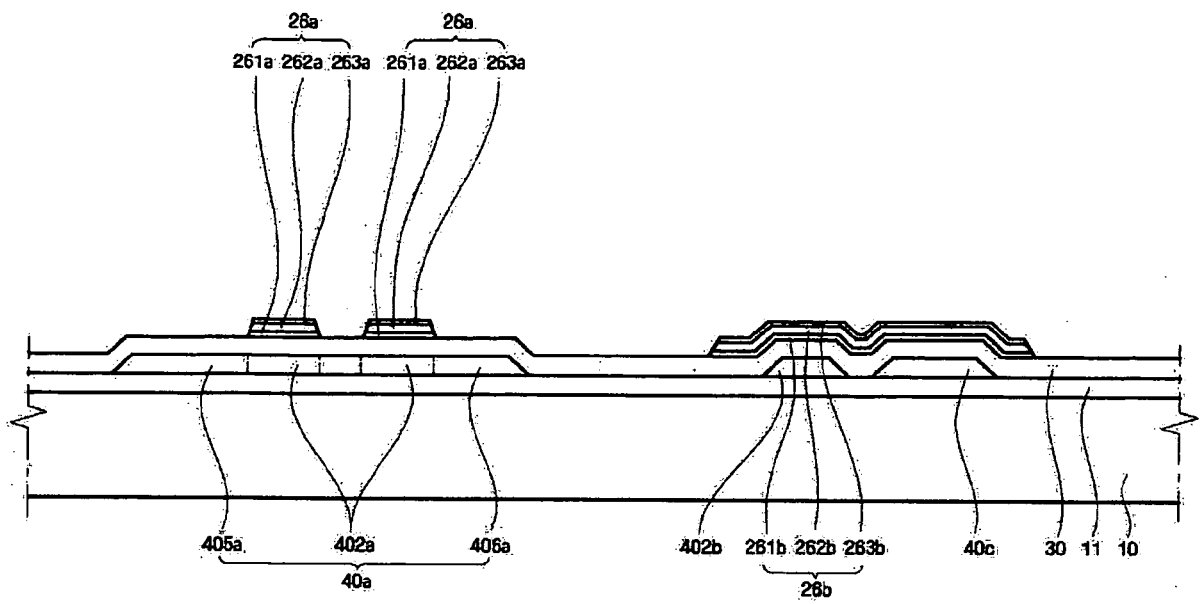
Figure 15C:
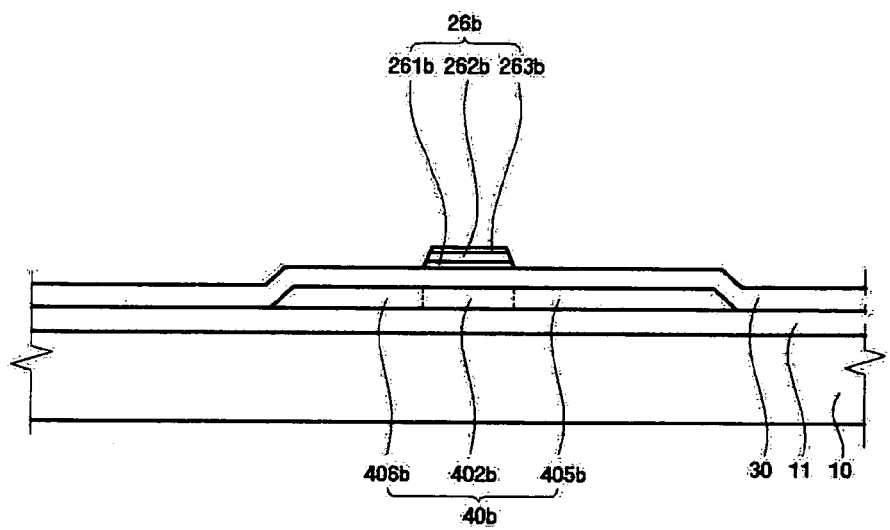
Figure 16A:
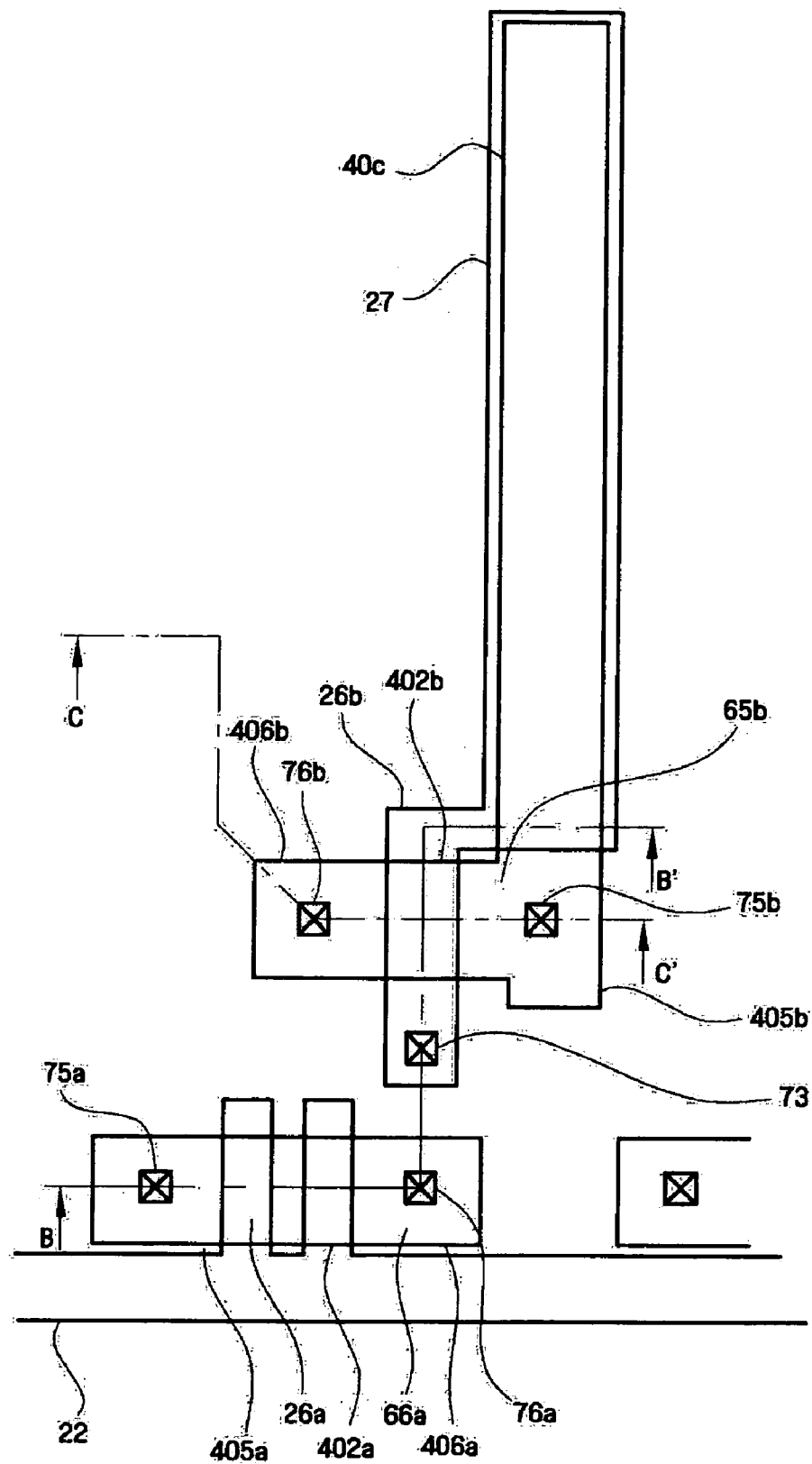
Figure 16B:
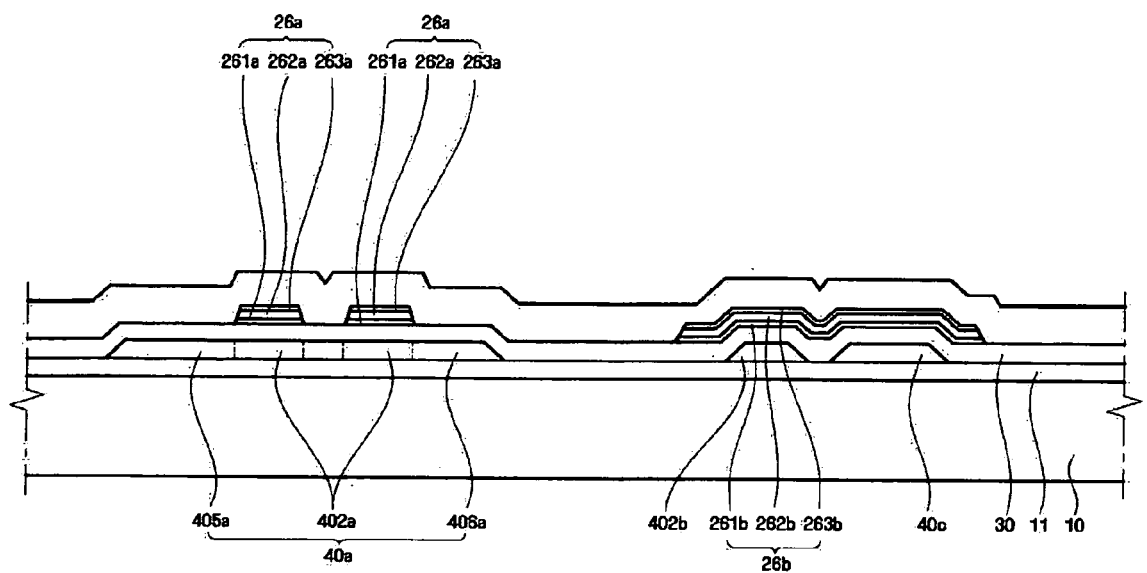
Figure 16C:
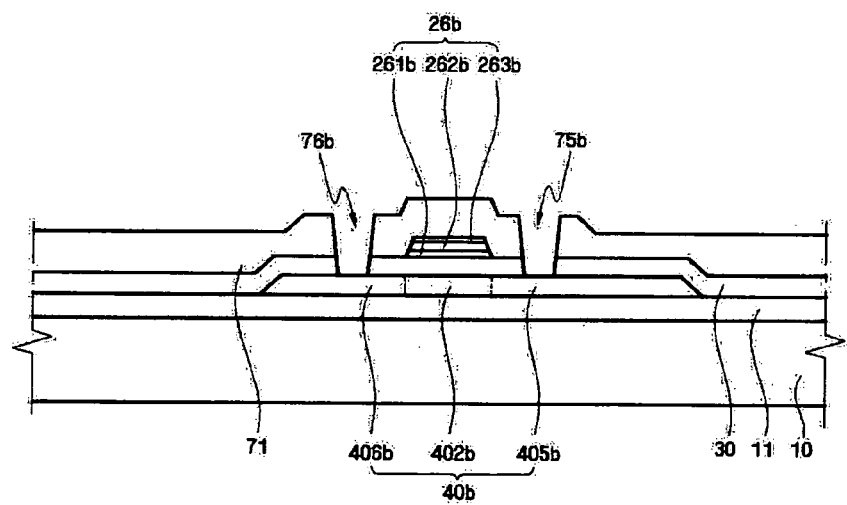
Figure 17A:
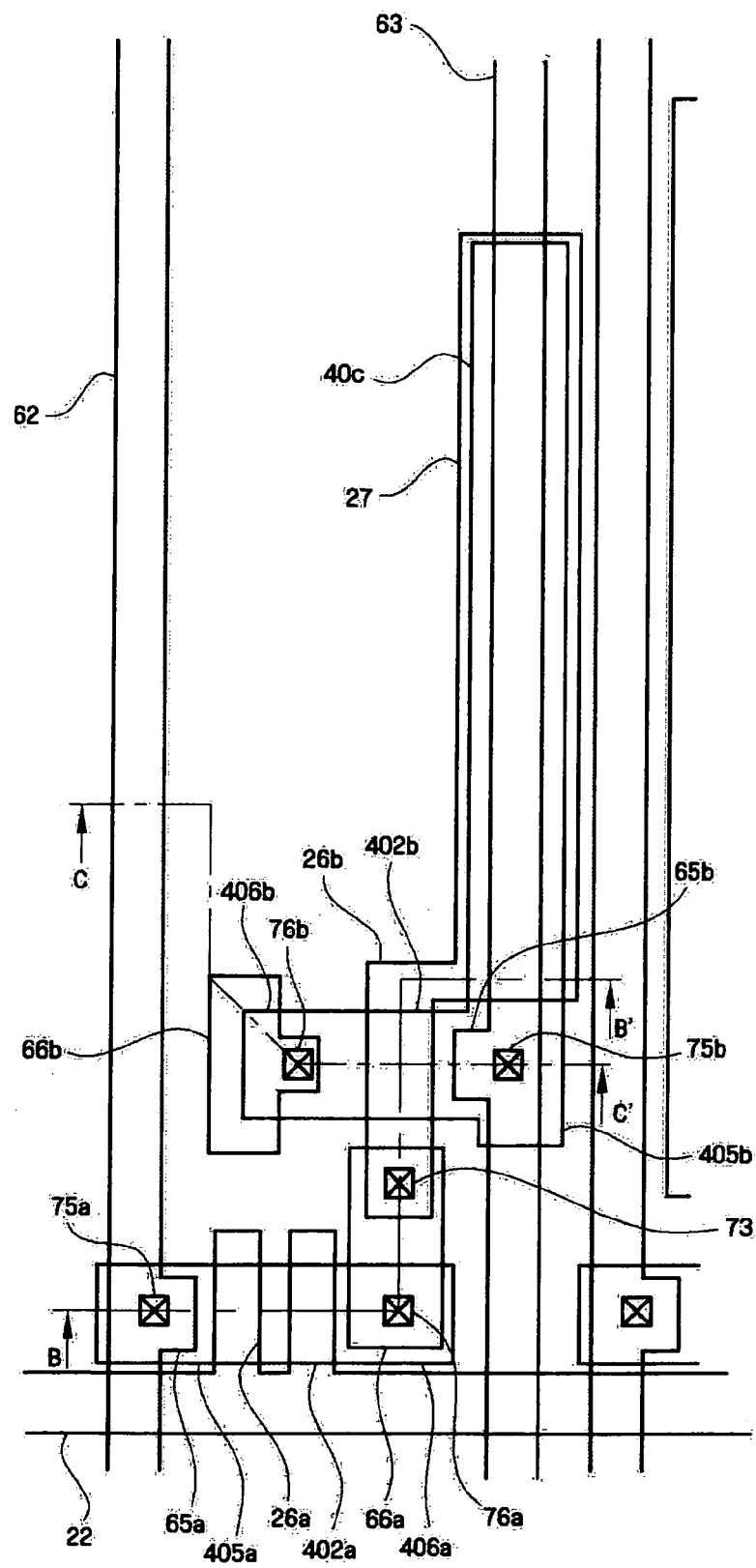
Figure 17B:
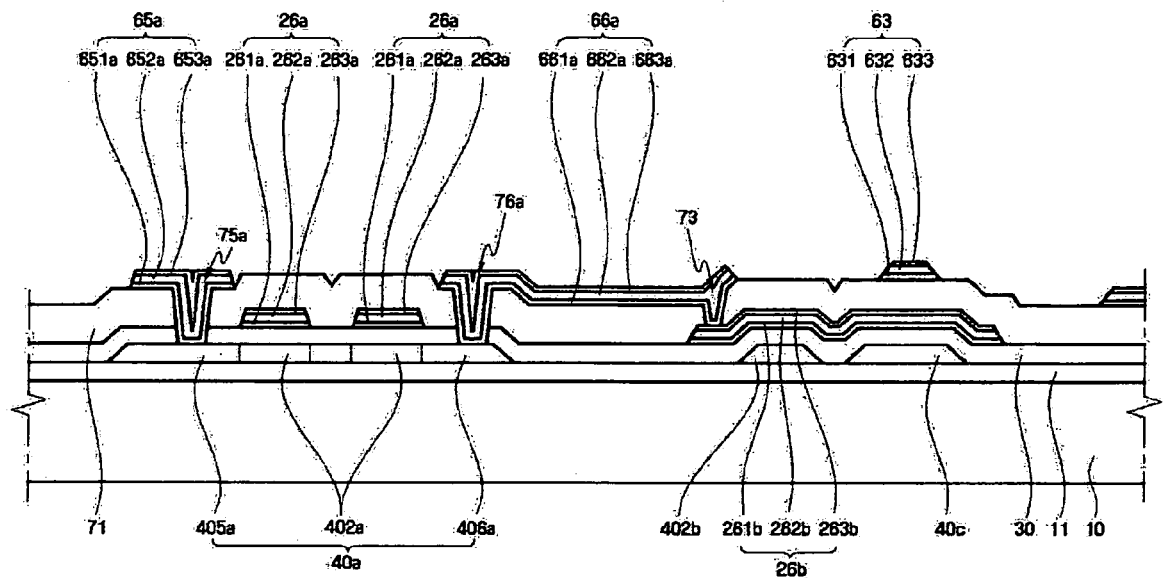
Figure 17C:
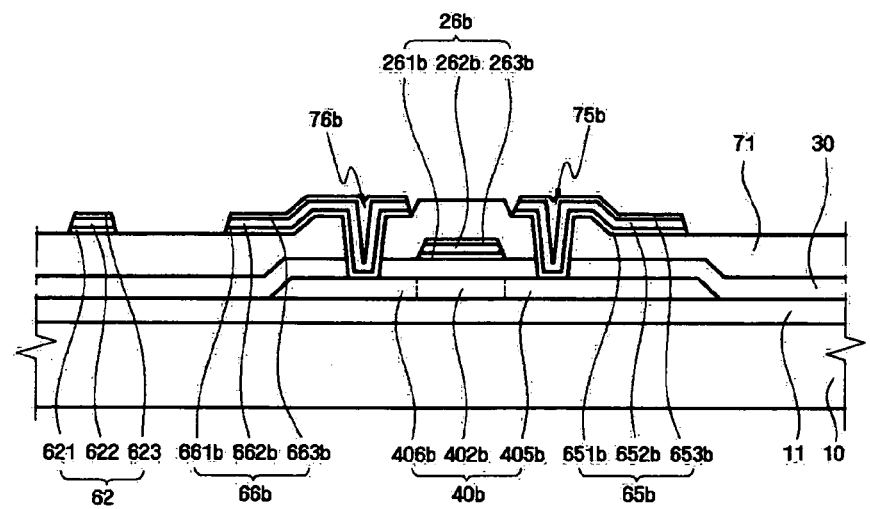
Figure 18A:
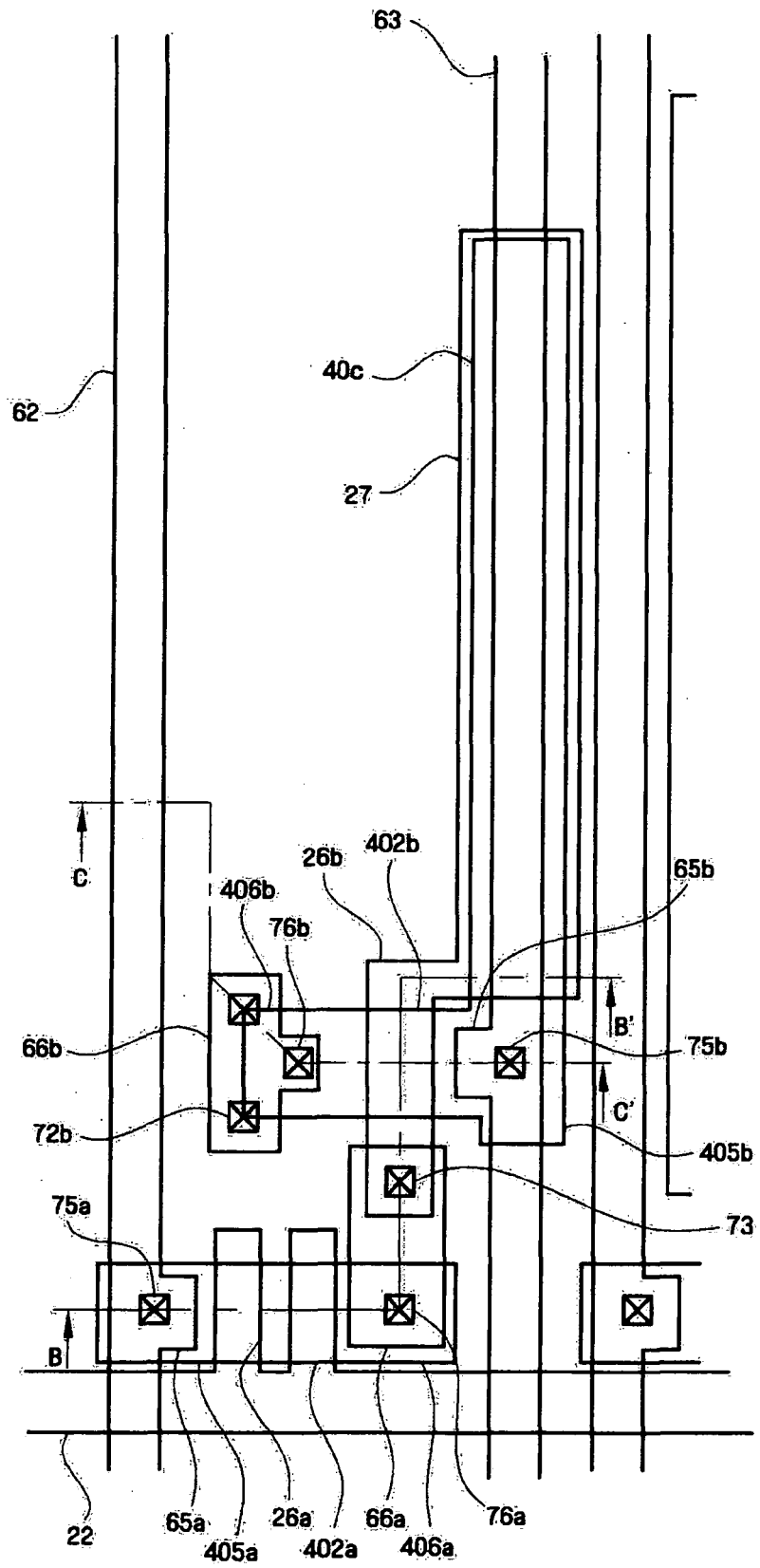
Figure 18B:
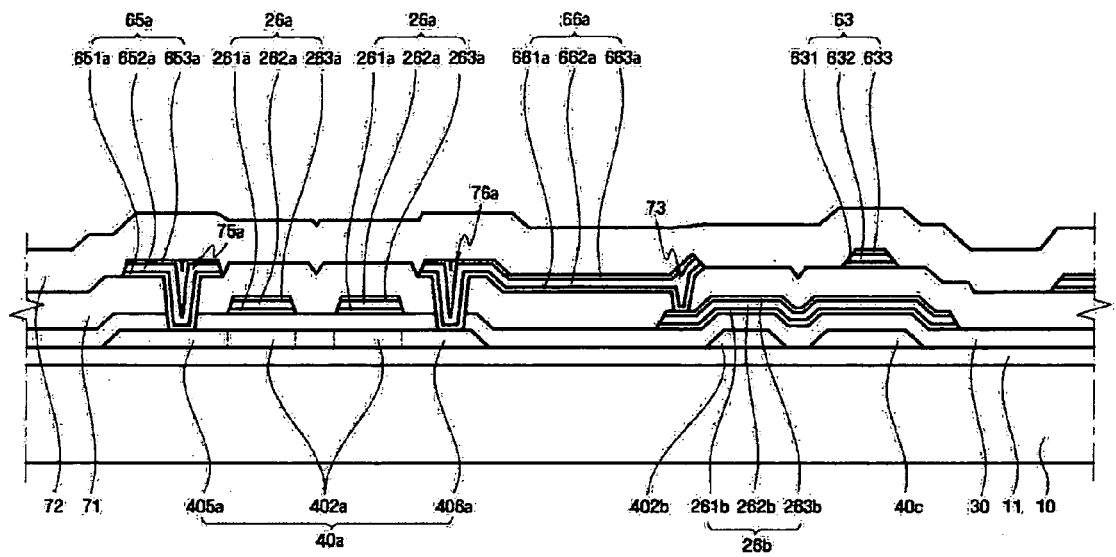
Figure 18C:
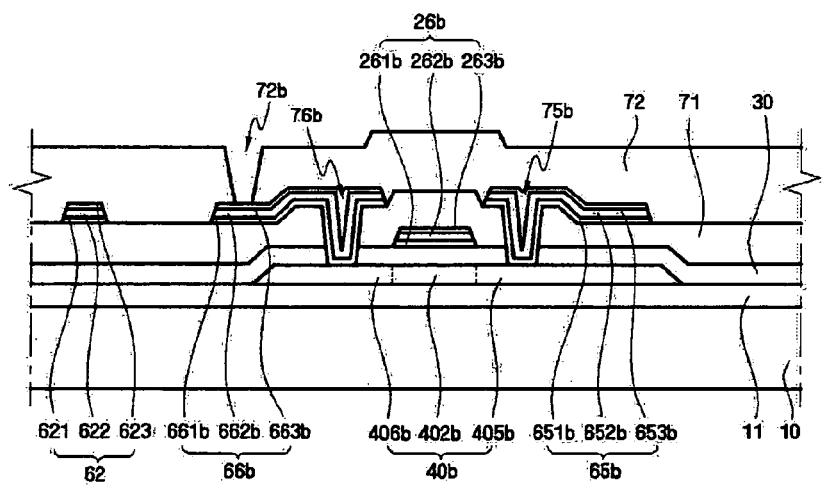
Figure 19A:
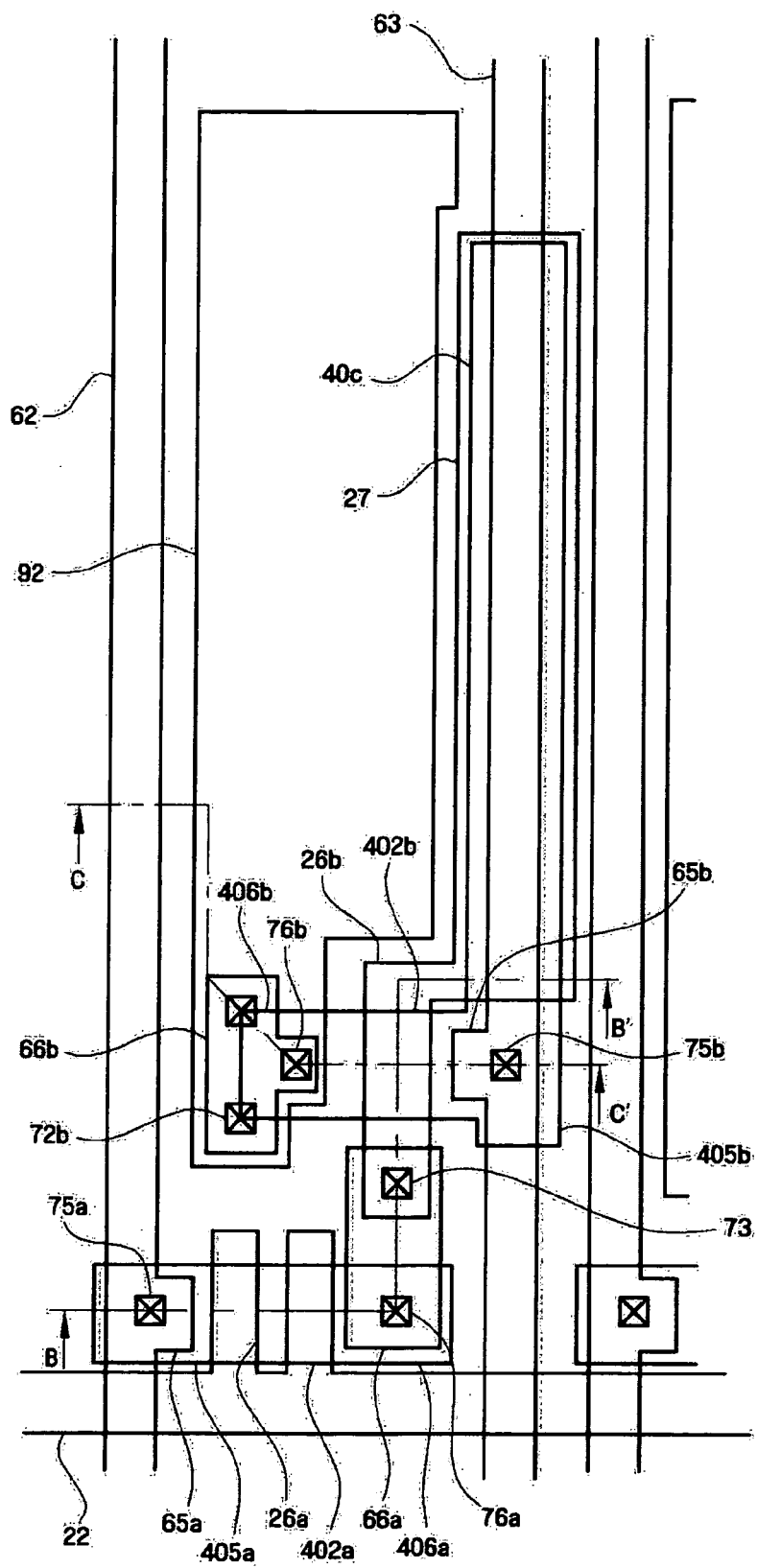
Figure 19B:
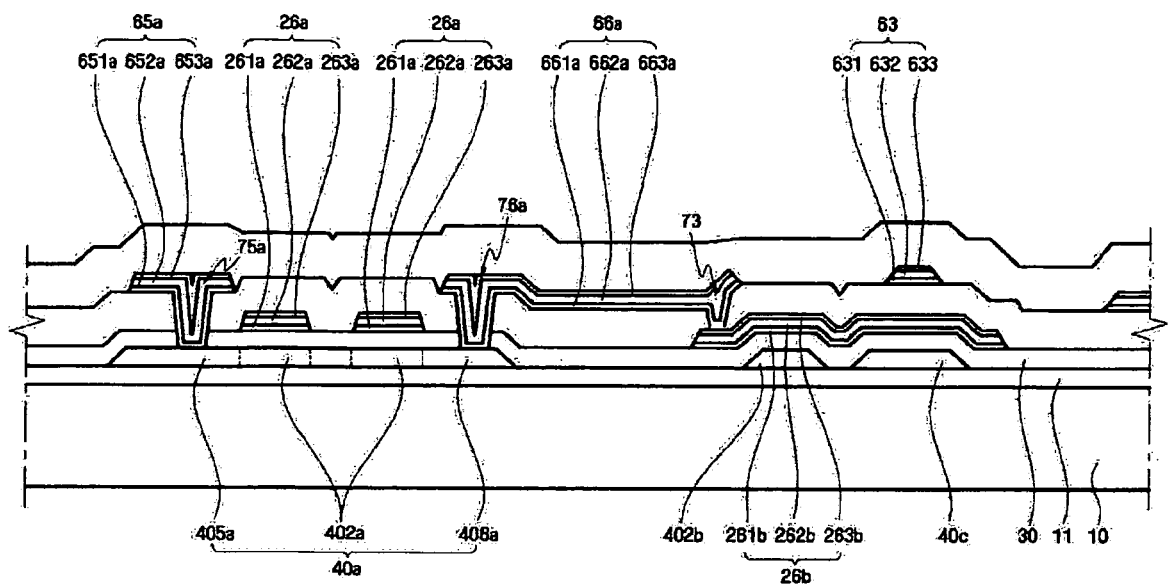
Figure 19C:
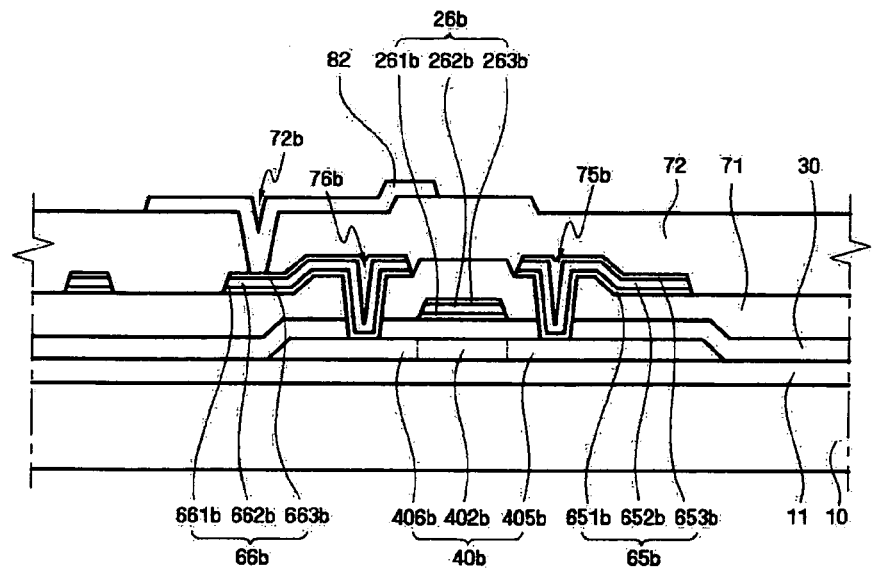

FIGS. 13A through 13C and FIGS. 14A through 19C illustrate other embodiments for a method for fabricating a TFT substrate according to the present invention. As before, the foregoing teachings and embodiments of the present invention can be used to appreciate fully the context of the method illustrated in FIGS. 13A-19C, without resort to duplicative descriptions. FIGS. 14A through 14C illustrate that blocking layer 11 can be formed on substrate 10 using, for example, silicon oxide. Amorphous silicon is deposited on blocking layer 11 using deposition techniques including, without limitation, low-pressure CVD (LPCVD) and plasma-enhanced CVD (PECVD), after which the deposited amorphous silicon can be patterned and crystallized into polycrystalline silicon using, for example, laser irradiation or annealing, such that polysilicon semiconductor layers 40a, 40b, and 40c are formed. FIGS. 15A through 15C, illustrate that gate insulating layer 30 may be formed by depositing an insulating layer on blocking layer 11 and on semiconductor layers 40a, 40b, and 40c disposed on blocking layer 11. A suitable exemplary insulating layer can be formed from silicon nitride, and can be deposited using, for example, CVD. Next, a three-layered gate structure is formed on gate insulating layer 30, by sequentially depositing a layer of molybdenum or a molybdenum alloy; a layer of copper or a copper alloy; and layer of molybdenum nitride, using, for example, sputtering deposition. First gate electrode 26a and gate line 22 then can be defined by forming a first photoresist pattern on the three-layered gate structure. It is beneficial to cover and protect a region of the substrate, for example, a region where second gate electrode 26b and storage electrode 27 are to be formed, including channel portion 402a of the second TFT, so that molybdenum nitride layer 263a, copper layer 262a, and molybdenum layer 261a can be sequentially- or batch-etched, for example, using the first photoresist pattern as an etching mask. Channel region 402a can be defined under first gate electrode 26a, with first source region 405a and a first drain region 406a being formed by injecting an n-type impurity ion into first thin film transistor semiconductor layer 40a. The first photoresist pattern can be removed, for example, using a photoresist stripper composition embodiment of the present invention, which composition includes butyldiglycol, an alkylpyrrolidone, an organic amine compound, aminopropylmorpholine, and a mercapto compound. Residual stripper composition and photoresist patterning can be removed by a wash with deionized water. As a result, gate line 22, first gate electrode 26a, and first source region 405a, and first drain region 406a are defined on semiconductor layer 40a, as is channel region 402a. A second photoresist pattern is formed, defining a second gate electrode 26b and a storage electrode 27. At this time, it is desirable to cover and protect first gate electrode 26a, gate line 22, and channel region 402a of the first thin film transistor, with the second photoresist pattern. Molybdenum nitride layer 263b, 273, copper layer 262b, 272, and molybdenum layer 261b, 271 can be etched sequentially or in a batch process, using the second photoresist pattern as an etching mask. By injecting a p-type impurity into semiconductor layer 40b of the second thin film transistor, second source region 405b and second drain region 406b can be formed, and channel region 402b can be defined under second gate electrode 26b. Then, the second photoresist pattern can be removed, for example, using a photoresist stripper composition embodiment of the present invention. As before, it is desirable to use a photoresist stripping composition in accordance with an embodiment of the present invention, which includes butyldiglycol, an alkylpyrrolidone, an organic amine compound, aminopropylmorpholine, and a mercapto compound. Residual stripper composition and photoresist patterning can be removed by a deionized water wash. As a result, second gate electrode 26b, storage electrode 27, second source region 405b, and second drain region 406b are defined on semiconductor layer 40b, as is channel region 402b. As described above with reference to FIG. 5, the photoresist stripper composition of the present invention provides good photoresist stripping capability and is capable of preventing corrosion of the copper-containing layers of the three-layered gate wire structure (22, 26a, 26b, 27), even after removal of the photoresist pattern 200. The resulting gate wire structure (22, 26a, 26b, 27) can maintain low resistance and can exhibit excellent linearity. Referring to FIGS. 16A through 16C, first interlayer insulating layer 71 is deposited on the gate insulating layer 30 having thereon gate wire structure (22, 26a, 26b, 27). Contact holes 75a, 76a, 75b, and 76b respectively exposing the first source region 405a, the first drain region 406a, the second source region 405b, and the second drain region 406b, and a contact hole 73 exposing a portion of the second gate electrode 26b, are formed using photolithography to etch layer 71. Referring to FIGS. 17A through 17C, three-layered data wire structure is formed using sputtering deposition techniques to sequentially form on the first interlayer insulating layer 71, a first layer of molybdenum or a molybdenum alloy; a second layer of copper or a copper alloy; and a third layer of molybdenum nitride are sequentially deposited. Those portions of semiconductor layers 40a and 40b exposed through the contact holes 75a, 76a, 75b, and 76b also have data wire structure layers sputtered sequentially thereon. The three-layered data wire structure is coated with a photoresist film, exposed to light, and developed, thereby forming a photoresist pattern defining a data wire structure (62, 63, 65a, 65b, 66a, 66b). Using the photoresist pattern as an etching mask the three-layered data structure can be patterned, using sequential or batch etching, after which the photoresist pattern can be removed, for example, using a photoresist stripper composition embodiment of the present invention, which composition includes butyldiglycol, an alkylpyrrolidone, an organic amine compound, aminopropylmorpholine, and a mercapto compound. Residual stripper composition and photoresist patterning can be removed by a deionized water wash. As a result, the data wire structure formed includes data line 62, extending in a column direction and defining pixels at its intersection with gate line 22; driving voltage line 63 for a driving voltage supply; first source electrode 65a, which is a branch of data line 62, being connected to first source region 405a via contact hole 75a; first drain electrode 66a separated from first source electrode 65a and connected to first drain region 406a via contact hole 76a; second source electrode 65b, which is a branch of driving voltage line 63, being connected to the second source region 405b via the contact hole 75b; and second drain electrode 66b, separated from second source electrode 65b and connected to second drain region 406b via contact hole 76b. As described above with reference to FIG. 5, the photoresist stripper composition of the present invention provides good photoresist stripping capability and is capable of preventing corrosion of the copper-containing layers of the three-layered gate wire structure (22, 26a, 26b, 27), even after removal of the photoresist pattern 200, so that resulting gate wire structure (22, 26a, 26b, 27) can maintain low resistance and can exhibit excellent linearity. In this way, the first and second thin film transistors of this and like embodiments are fabricated as top gate mode thin film transistors, wherein gate electrodes 26a and 26b, source electrodes 65a and 65b, and drain electrodes 66a and 66b are disposed on the semiconductor layers 40a and 40b. FIGS. 18A through 18C, illustrate that second interlayer insulating layer 72 is deposited and patterned to form a contact hole 72b, exposing the second drain electrode 66b. FIGS. 19A through 19C depict that a metal with good reflectivity such as aluminum, an aluminum alloy, silver, or a silver alloy is deposited and patterned to form a pixel electrode 82. Returning to FIGS. 13A through 13C, a black pigment-containing organic film is coated on the second interlayer insulating layer 72, having thereon the pixel electrode 82, exposed to light and developed, forming partition wall 91, which covers all areas, except an organic light-emitting area. Organic light-emitting layer 92 is formed in the organic light-emitting area using, for example, deposition or inkjet printing. Partition wall 91 and the organic light-emitting layer 92 are then coated with a conductive organic material to form buffer layer 95. Subsequently, common electrode 100 may be formed by depositing ITO or indium zinc oxide (IZO) on buffer layer 95. It also may be desirable to make pixel electrode 82 of a transparent conductive material such as ITO or IZO. In this case, common electrode 100 may be made of a high reflectivity material, including, without limitation, aluminum, an aluminum alloy, silver, or a silver alloy.

The TFT substrates and the fabrication methods thereof, according to several embodiments of the present invention have been described with regard to one or both of a three-layered gate wire structure and a three-layered data wire structure. As illustrated, each three-layered data wire structure generally includes a molybdenum layer, a copper layer, and a molybdenum nitride layer. Nevertheless, it may be desirable to provide one or both of the gate wire structure and the data wire structure as a structure having a single layer, a double layer, or more than three layers. These diverse layers, as well as the method for forming and for fabricating same, are within the scope of the present invention. Also, embodiments of the present invention do not require that the gate wire structure and the data wire structure have identical structures in composition or in the number of layers; that both of the gate wire structure and the data wire structure be in accordance with embodiments of the present invention; or that inventive stripper compositions described herein be employed at every point, or at any particular point, during fabrication, in order to be within the scope of the present invention. The foregoing embodiments and their foreseeable equivalents may be combined with other substrates, structures, or compositions that well-known to persons having ordinary skill in the art, to be within the scope of the present invention. While the structures and substrates according to embodiments of the present invention, including a TFT substrate, may have been described in terms of one or more of switching TFT, driving TFT, top gate-type TFT, and bottom gate-type TFT as applied to liquid crystal displays, whether or not of a reflective type, it is to be understood that the apparatus and fabrication embodiments of the present invention also may be efficaciously applied to organic electroluminescent-type displays. Also, elements such as partition walls and organic EL layers, if desirable for a particular implementation of organic electroluminescent embodiments of the present invention, may not be required for all organic EL displays, or for liquid crystal displays.

A number of embodiments of the present invention have been described, and the present invention should not be construed as being limited to these embodiments. It is to be understood that the use of any and all examples, or exemplary terms provided herein is intended merely to better illuminate the invention and is not a limitation on the scope of the invention unless otherwise specified. Nevertheless, it will be understood that various modifications may be made without departing from the spirit and scope of the invention. Accordingly, it is to be understood that the invention is not to be limited by the specific illustrated embodiments, but only by the scope of the claims.

What is claimed is:

1. A method for forming a wire structure, the method comprising:
   depositing a copper-containing conductive layer on a lower structure;
   forming a photoresist pattern defining a wire structure on the conductive layer;
   etching the conductive layer using the photoresist pattern as an etching mask; and
   stripping the photoresist pattern using a photoresist stripper composition, comprising:
   butyl diglycol in a concentration of between about 50 WT % to about 70 WT %;
   an alkylpyrrolidone in a concentration of between about 20 WT % to about 40 WT %;
   an organic amine compound in a concentration of between about 1 WT % to about WT %;
   aminopropylmorpholine in a concentration of between about 1 WT % to about 5 WT %; and
   a mercapto compound in a concentration of between about 0.01 WT % to about 0.5 WT %.

2. The method of claim 1, wherein the alkylpyrrolidone is N-methylpyrrolidone, and the organic amine compound is diethanolamine.

3. The method of claim 1, wherein stripping of the photoresist pattern further comprises spraying the photoresist stripper composition on the photoresist pattern.

4. The method of claim 1, wherein stripping of the photoresist pattern further comprises stripping of the photoresist pattern for between about 60 seconds to about 180 seconds.

5. The method of claim 1, further comprising removing a residue of the photoresist pattern after the stripping of the photoresist pattern.

6. The method of claim 5, wherein removing a residue of the photoresist pattern further comprises washing the residue of the photoresist pattern by spraying with deionized water.

7. The method of claim 1, wherein each of the copper-containing conductive layer and the wire structure comprises a multi-layered structure including a molybdenum layer, a copper layer, and a molybdenum nitride layer.

8. The method of claim 1, wherein the lower structure comprises one of an insulating material and a semiconductor material.

9. A method for fabricating a thin film transistor, comprising:
   forming a gate wire structure on an insulating substrate, wherein forming the gate wire structure includes forming a gate line of the gate wire structure to extend in a first direction and forming a gate electrode connected to the gate line;
   forming a data wire structure on the insulating substrate, wherein the forming a data wire structure includes forming the data wire structure to be insulated from the gate wire structure, forming a data line of the data wire structure to extend in a second direction to intersect with the gate line, forming a source electrode connected to the data line, and forming a drain electrode separated from the source electrode,
   wherein the forming one of the gate wire structure and the data wire structure comprises:
   depositing a copper-containing conductive layer on a lower structure;
   forming a photoresist pattern defining one of the gate wire structure and the data wire structure on the conductive layer;
   etching the conductive layer using the photoresist pattern as an etching mask; and
   stripping the photoresist pattern using a photoresist stripper composition, wherein the photoresist stripper composition comprises
   butyldiglycol in a concentration of between about 50 WT % to about 70 WT %;
   an alkylpyrrolidone in a concentration of between about 20 WT % to about 40 WT %;
   an organic amine compound in a concentration of between about 1 WT % to about 10 WT %;
   aminopropylmorpholine in a concentration of between about 1 WT % to about 5 WT %, and
   a mercapto compound in a concentration of between about 0.01 WT % to about 0.5 WT %.

10. The method of claim 9, wherein the alkylpyrrolidone is N-methylpyrrolidone, and the organic amine compound is diethanolamine.

11. The method of claim 9, wherein stripping of the photoresist pattern further comprises spraying the photoresist stripper composition on the photoresist pattern.

12. The method of claim 9, wherein stripping of the photoresist pattern further comprises stripping of the photoresist pattern for between about 60 to about 180 seconds.

13. The method of claim 9, further comprising removing a residue of the photoresist pattern after the stripping the photoresist pattern.

14. The method of claim 13, wherein removing of the residue of the photoresist pattern further comprises, washing the residue of the photoresist pattern by spraying with deionized water.

15. The method of claim 9, wherein the copper-containing conductive layer has a multi-layered structure composed of a molybdenum layer, a copper layer, and a molybdenum nitride layer, and wherein the wire structure has a multi-layered structure composed of a molybdenum layer, a copper layer, and a molybdenum nitride layer.

16. A method for fabricating a thin film transistor, comprising stripping a photoresist pattern formed on a lower structure using a photoresist stripper composition that comprises:
- butyldiglycol in a concentration of between about 50 WT % to about 70 WT %;
- N-methylpyrrolidone in a concentration of between about 20 WT % to about 40 WT %;
- diethanolamine in a concentration of between about 1 WT % to about 10 WT %;
- aminopropylmorpholine in a concentration of between about 1 WT % to about 5 WT %, and
- a mercapto compound in a concentration of between about 0.01 WT % to about 0.5 WT %,
  wherein the photoresist pattern defines a wire structure formed on the lower structure, and wherein the wire structure is one of a TFT gate wire structure and a TFT data wire structure.

17. The method of claim 16, wherein the wire structure comprises a molybdenum layer, a copper layer, and a molybdenum nitride layer.

18. The method of claim 16, further comprising stripping the photoresist pattern for between about 60 seconds to about 180 seconds.

* * * * *